United States Patent
Kumagae et al.

(10) Patent No.: US 10,361,086 B2
(45) Date of Patent: Jul. 23, 2019

(54) SEMICONDUCTOR DEVICE AND METHOD OF MANUFACTURING THE SAME

(71) Applicant: Renesas Electronics Corporation, Tokyo (JP)

(72) Inventors: Seiji Kumagae, Hitachinaka (JP); Kazuyuki Ozeki, Hitachinaka (JP); Katsuyoshi Kogure, Hitachinaka (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 15/831,101

(22) Filed: Dec. 4, 2017

(65) Prior Publication Data
US 2018/0182631 A1    Jun. 28, 2018

(30) Foreign Application Priority Data
Dec. 28, 2016 (JP) ................ 2016-256109

(51) Int. Cl.
*H01L 21/28* (2006.01)
*H01L 29/423* (2006.01)
(Continued)

(52) U.S. Cl.
CPC .. *H01L 21/28282* (2013.01); *H01L 21/32135* (2013.01); *H01L 27/1157* (2013.01);
(Continued)

(58) Field of Classification Search
CPC ........... H01L 21/28282; H01L 29/4234; H01L 29/42344; H01L 29/42328;
(Continued)

(56) References Cited

U.S. PATENT DOCUMENTS

2005/0085039 A1    4/2005  Yasui et al.
2016/0307909 A1*  10/2016  Tseng ................. H01L 27/1157

FOREIGN PATENT DOCUMENTS

JP    2004-111749 A    4/2004
JP    2005-123518 A    5/2005
(Continued)

*Primary Examiner* — Thanhha S Pham
(74) *Attorney, Agent, or Firm* — McGinn IP Law Group, PLLC.

(57) ABSTRACT

In a split-gate-type MONOS memory, increase in a defective rate due to variation in a gate length of a memory gate electrode is prevented, and reliability of a semiconductor device is improved. A first dry etching having a high anisotropic property but a low selection ratio relative to silicon oxide is performed to a silicon film, and then, a second dry etching having a low anisotropic property but a high selection ratio relative to silicon oxide is performed thereto, so that a control gate electrode composed of the silicon film is formed, and then, a sidewall-shaped memory gate electrode is formed on a side surface of the control gate electrode. In this case, respective etching amounts of the first dry etching and the second dry etching are controlled by determining a length of etching time in accordance with desired characteristics of a manufactured memory and a film thickness of the silicon film in the first dry etching, based on an etching time setting table, so that a gate length of the memory gate electrode is controlled.

10 Claims, 20 Drawing Sheets

| | SILICON FILM THICKNESS a [nm] | | | | |
|---|---|---|---|---|---|
| | SECTION1 246±2 | SECTION2 248±2 | SECTION3 250±2 | SECTION4 252±2 | SECTION5 254±2 |
| PRODUCT A GATE LENGTH OF MEMORY GATE ELECTRODE: LARGE (HIGH WRITING SPEED /LOW ERASING SPEED) | 50sec | 51sec | 52sec | 53sec | 54sec |
| PRODUCT B GATE LENGTH OF MEMORY GATE ELECTRODE: STANDARD (STANDARD WRITING /ERASING SPEEDS) | 48sec | 49sec | 50sec | 51sec | 52sec |
| PRODUCT C GATE LENGTH OF MEMORY GATE ELECTRODE: SMALL (LOW WRITING SPEED /HIGH ERASING SPEED) | 46sec | 47sec | 48sec | 49sec | 50sec |

(51) Int. Cl.
*H01L 21/321* (2006.01)
*H01L 27/1157* (2017.01)
*H01L 29/66* (2006.01)
*H01L 21/3213* (2006.01)
*H01L 29/792* (2006.01)

(52) U.S. Cl.
CPC .. *H01L 29/42344* (2013.01); *H01L 29/66833* (2013.01); *H01L 29/792* (2013.01)

(58) Field of Classification Search
CPC ............. H01L 29/66833; H01L 29/792; H01L 27/1157; H01L 21/32136; H01L 21/32137
See application file for complete search history.

(56) References Cited

FOREIGN PATENT DOCUMENTS

| | | |
|---|---|---|
| JP | 2012-094790 A | 5/2012 |
| JP | 2014-072484 A | 2/2014 |

* cited by examiner

FIG. 11

| | SILICON FILM THICKNESS a [nm] | | | | |
|---|---|---|---|---|---|
| | SECTION1 246±2 | SECTION2 248±2 | SECTION3 250±2 | SECTION4 252±2 | SECTION5 254±2 |
| PRODUCT A GATE LENGTH OF MEMORY GATE ELECTRODE: LARGE (HIGH WRITING SPEED /LOW ERASING SPEED) | 50sec | 51sec | 52sec | 53sec | 54sec |
| PRODUCT B GATE LENGTH OF MEMORY GATE ELECTRODE: STANDARD (STANDARD WRITING /ERASING SPEEDS) | 48sec | 49sec | 50sec | 51sec | 52sec |
| PRODUCT C GATE LENGTH OF MEMORY GATE ELECTRODE: SMALL (LOW WRITING SPEED /HIGH ERASING SPEED) | 46sec | 47sec | 48sec | 49sec | 50sec |

FIG. 32

| | OPERATION SYSTEM WRITING/ERASING | WRITING OPERATION VOLTAGE (V) Vmg/Vs/Vcg/Vd/Vb | ERASING OPERATION VOLTAGE (V) Vmg/Vs/Vcg/Vd/Vb | READING OPERATION VOLTAGE (V) Vmg/Vs/Vcg/Vd/Vb |
|---|---|---|---|---|
| A | SSI(WRITING)/ BTBT(ERASING) | 10/5/1/0.5/0 | -6/6/0/open/0 | 0/0/1.5/1.5/0 |
| B | SSI(WRITING)/ FN(ERASING) | 10/5/1/0.5/0 | 12/0/0/0/0 | 0/0/1.5/1.5/0 |
| C | FN(WRITING)/ BTBT(ERASING) | -12/0/0/0/0 | -6/6/0/open/0 | 0/0/1.5/1.5/0 |
| D | FN(WRITING)/ FN(ERASING) | -12/0/0/0/0 | 12/0/0/0/0 | 0/0/1.5/1.5/0 |

SEMICONDUCTOR DEVICE AND METHOD OF MANUFACTURING THE SAME

CROSS-REFERENCE TO RELATED APPLICATION

The present application claims priority from Japanese Patent Application No. 2016-256109 filed on Dec. 28, 2016, the content of which is hereby incorporated by reference into this application.

TECHNICAL FIELD OF THE INVENTION

The present invention relates to a semiconductor device and a method of manufacturing the same, and can be used for, for example, manufacturing a semiconductor device having a nonvolatile memory.

BACKGROUND OF THE INVENTION

As a nonvolatile semiconductor storage device capable of electrically performing writing and erasing operations, an EEPROM (Electrically Erasable and Programmable Read Only Memory) has been widely used. Such a storage device has a trapping insulating film or a conductive floating gate electrode surrounded by an oxide film below a gate electrode of an MISFET, and reads, as a threshold of a transistor, storage information that is a charge storage state in the floating gate or the trapping insulating film (charge retention part).

The trapping insulating film means an insulating film capable of storing a charge, and, for example, a silicon nitride film or others is cited as one example. By injecting and discharging the charge to and from a charge storage region, the threshold of the MISFET is shifted so as to be operated as a storage element. As the nonvolatile semiconductor storage device using the trapping insulating film, a split gate-type cell using an MONOS (Metal Oxide Nitride Oxide Semiconductor) film is cited.

Patent Document 1 (Japanese Patent Application Laid-open Publication No. 2014-72484), Patent Document 2 (Japanese Patent Application Laid-open Publication No. 2005-123518), Patent Document 3 (Japanese Patent Application Laid-open Publication No. 2012-94790) and Patent Document 4 (Japanese Patent Application Laid-open Publication No. 2004-111749) describe that a taper is formed on a side surface of a control (selection) gate electrode in the split gate-type MONOS memory. Moreover, Patent Document 3 describes that a lower portion of a side surface of a control gate electrode adjacent to a memory gate electrode is recessed through ONO (Oxide Nitride Oxide).

SUMMARY OF THE INVENTION

In the split gate-type MONOS memory, a size of a gate length of a memory gate electrode significantly affects on the characteristics of the memory. Here, when a control gate electrode of the split gate-type MONOS memory is formed by etching, the control gate electrode is formed by performing a first etching process having a high anisotropy, and then, a second etching process having a low anisotropy in some cases in order to finish the etching at an appropriate timing. When the respective etching amounts of these etching processes are not particularly controlled, the shape of the control gate electrode is varied, and therefore, there is a problem of variation in the characteristics of the memory due to variation in the gate length of the memory gate electrode caused by the shape variation.

Moreover, if elements that are different from each other in the gate length of the memory gate electrode can be formed on different wafers, a product on which a memory having desired characteristics can be formed for each of wafers, so that a low cost on the semiconductor device can be achieved.

However, the size of the gate length of the sidewall-shaped memory gate electrode that is formed on a side surface of a control gate electrode is dependent on a film thickness of a conductive film to be formed for forming the memory gate electrode. Therefore, the film forming process of the conductive film is performed by a film forming method of a batch system in which film forming processes are simultaneously performed on a large number of wafers. In this case, it is difficult to separately form memory gate electrodes that are different from one another in the gate length among the wafers. For the same reason, it is difficult to separately form memory gate electrodes that are different from one another in the gate length among chips obtained from a single wafer, and it is also difficult to mount the memory gate electrodes that are different from one another in the gate length together on a single chip.

Other object and novel characteristics will be apparent from the description of the present specification and the accompanying drawings.

The typical ones of the inventions disclosed in the present application will be briefly described as follows.

In a method of manufacturing a semiconductor device according to one embodiment, in accordance with an etching condition setting table, a distance along which the side surface of the control gate electrode is perpendicularly processed is controlled in accordance with a film thickness of a conductive film formed for forming a control gate electrode, so that a tail length of a lower portion of the side surface of the control gate electrode is controlled, and then, the memory gate electrode is formed on the side surface of the control gate electrode through a charge storage film.

The semiconductor device according to the embodiment has a split gate-type first memory cell and a split gate-type second memory cell on a semiconductor substrate, and a first gate length of a first memory gate electrode of the first memory cell is smaller than a second gate length of a second memory gate electrode of the second memory cell.

According to the embodiment, the reliability of the semiconductor device can be improved.

Alternatively, a performance of the semiconductor device can be improved.

BRIEF DESCRIPTIONS OF THE DRAWINGS

FIG. 11 is a table showing a setting table of breakthrough time at the time of processing a control gate electrode of the semiconductor device according to the first embodiment of the present invention;

FIG. 32 is a table showing one example of a voltage application condition to each portion of a selective memory cell at the time of "writing", "erasing", and "reading"

DESCRIPTIONS OF THE PREFERRED EMBODIMENTS

Figure 1:
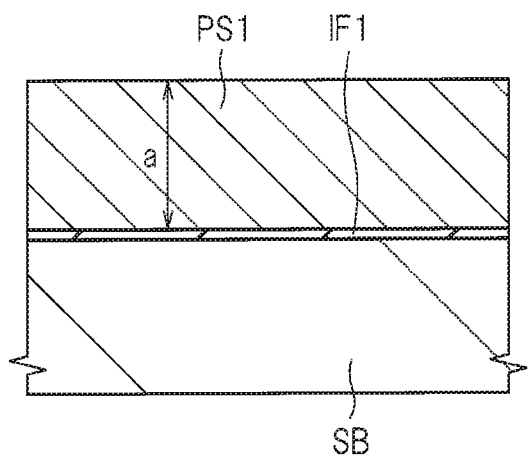
FIG. 1 is a cross-sectional view during a process of manufacturing a semiconductor device according to a first embodiment of the present invention.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when with reference to the number of elements (including number of pieces, values, amount, range, and others), the number of the elements is not limited to a specific number unless otherwise stated or except the case where the number is apparently limited to a specific number in principle. The number larger or smaller than the specified number is also applicable. Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and others are described, the substantially approximate and similar shapes and others are included therein unless otherwise stated or except the case where it is conceivable that they are apparently excluded in principle. The same goes for the numerical value and the range described above.

Hereinafter, embodiments will be described in detail with reference to the accompanying drawings. Note that components having the same function are denoted by the same reference symbols throughout all the drawings for describing the embodiment, and the repetitive description thereof will be omitted. In the following embodiments, the description of the same or similar parts is not repeated in principle unless otherwise particularly required.

The semiconductor device of the present application is a semiconductor device having a nonvolatile memory (nonvolatile storage element, flash memory, nonvolatile semiconductor storage device). The nonvolatile memory explained in this specification is a split gate-type MONOS-type memory (hereinafter, simply referred to as MONOS memory). In the following embodiments, as the nonvolatile memory cell, explanations will be made about a memory cell basically configured of an n-channel type MISFET (MISFET: Metal Insulator Semiconductor Field Effect Transistor).

Moreover, the polarity (polarity of an applied voltage and polarity of a carrier at the time of writing, erasing and reading) described in the present application is used for explaining operations of the memory cell basically configured of the n-channel type MISFET. If it is basically configured of a p-channel type MISFET, the same operations can be obtained in principle by inverting all the polarities of conductive types of the applied electric potential and the carrier or others.

Furthermore, a mask described in the present application indicate a protective mask (etching mask) for protecting a part of objects from the etching or a protective mask (ion-implantation inhibiting mask) for protecting a part of objects from ion implantation.

First Embodiment

<Method of Manufacturing Semiconductor Device>

A method of manufacturing a semiconductor device according to the present embodiment will be described with reference to FIG. 1 to FIG. 11. Each of FIG. 1 to FIG. 10 is a cross-sectional view during a process of manufacturing the semiconductor device of the present embodiment. FIG. 11 shows one example of a setting table for a breakthrough time (etching time) at the time of processing a control gate electrode. Here, a case of formation of an n-channel type MISFET (control transistor and memory transistor) will be described. However, a p-channel type MISFET (control transistor and memory transistor) may be formed by reversing the conductive type.

In the process of manufacturing the semiconductor device of the present embodiment, first, as shown in FIG. 1, a semiconductor substrate (semiconductor wafer) SB made of a p-type single crystal silicon (Si) or others having a specific resistance of, for example, about 1 to 10 Ωcm is prepared. Successively, a trench is formed in a main surface of the semiconductor substrate SB, so that an element isolation region (not shown) is formed inside the trench. The element isolation region is made of, for example, a silicon oxide film, and can be formed by an STI (Shallow Trench Isolation) method. However, the element isolation region may be formed by using, for example, an LOCOS (Local Oxidization of Silicon) method or others. Note that the region shown in FIG. 1 is a region where the memory cell is formed later.

Successively, by performing an ion implantation into the main surface of the semiconductor substrate SB, a p-type well (not shown) is formed on the main surface of the semiconductor substrate SB. The well is formed by implanting a p-type impurity (for example, B (boron)) into the main surface of the semiconductor substrate SB at a comparatively low concentration. The well is formed from the main surface of the semiconductor substrate SB down to the middle of the semiconductor substrate SB. Then, a heat treatment is performed on the semiconductor substrate SB so that the impurity inside the well is diffused. Note that an n-type well is formed in a region, where a p-type field effect transistor or a memory cell including the transistor is to be formed, by ion implantation of an n-type impurity (for example, arsenic (As) or P (phosphorus)) into the main surface of the semiconductor substrate SB although neither illustrated nor explained in detail.

Successively, by performing an ion implantation into the main surface of the semiconductor substrate SB, a channel region (not shown) serving as a p-type semiconductor region is formed on the main surface of the semiconductor substrate SB. The channel region is formed by implanting a p-type impurity (for example, B (boron)) into the main surface of the semiconductor substrate SB at a comparatively low concentration. The channel region is formed on the main surface of the semiconductor substrate SB, and the formation depth of the channel region is shallower than the formation depth of the well. The channel region plays a role of adjustment of threshold voltages of a control transistor and a memory transistor to be formed later.

Successively, by performing thermal oxidation or others, an insulating film IF1 is formed on the exposed upper surface of the semiconductor substrate SB. Thus, the upper surface of the semiconductor substrate SB is covered with the insulating film IF1. The insulating film IF1 is made of, for example, a silicon oxide film. Then, on the entire main surface of the semiconductor substrate SB, a silicon film PS1 is formed by using, for example, a CVD (Chemical Vapor Deposition) method. Thus, the silicon film PS1 is formed on the semiconductor substrate SB through the insulating film IF1. The silicon film PS1 is a conductive film for use in forming a control gate electrode CG to be described later.

The silicon film PS1 may be formed as an amorphous silicon film first at the time of film formation, and then, the amorphous silicon film may be changed into the silicon film PS1 made of a polycrystalline silicon film by a subsequent heat treatment. Moreover, the silicon film PS1 may also be formed as a conductive film having a low resistance by not introducing an impurity thereto at the time of film formation but ion-implanting an n-type impurity (for example, arsenic (As) or P (phosphorous)) thereto after the film formation and diffusing the impurity by a subsequent heat treatment. The film thickness of the silicon film PS1 is expressed by a film thickness (distance) "a" as shown in FIG. 1. A unit of the film thickness (distance) "a" is "nm". Here, the film thickness "a" of the silicon film PS1 is, for example, 250 nm.

Figure 2:
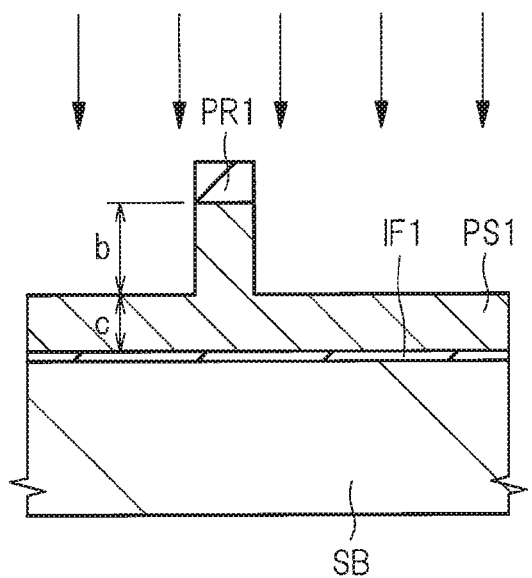
FIG. 2 is a cross-sectional view during a process of manufacturing the semiconductor device, continued from FIG. 1.
Figure 3:
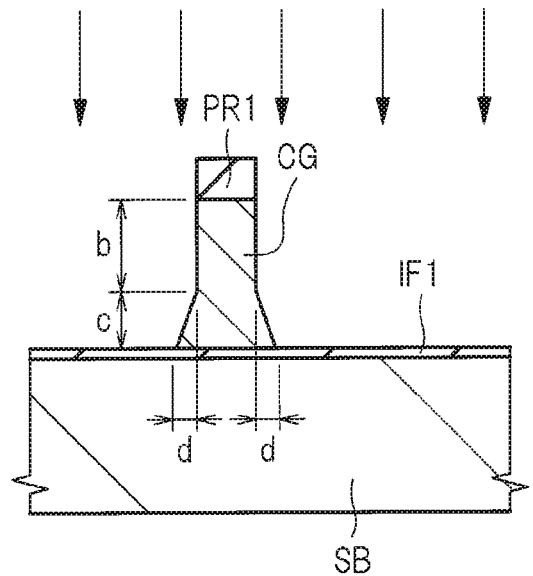
FIG. 3 is a cross-sectional view during a process of manufacturing the semiconductor device, continued from FIG. 2.

Next, a part of the silicon film PS1 is removed by performing a first dry etching (anisotropic etching) using a photolithography technique as shown in FIG. 2, and then, the entire film thickness of the silicon film PS1 is removed by performing a second dry etching while changing an etching condition as shown in FIG. 3, so that a control gate electrode CG made of the silicon film PS1 is formed. The purposes of the change in the etching condition in the middle of the process are to end the etching for forming the control gate electrode CG at an appropriate timing and to form a laterally-expanding tail shape in only a lower portion of a side surface of the control gate electrode CG.

That is, as shown in FIG. 2, a resist pattern made of a photoresist film PR1 is formed on the upper surface of the silicon film PS1. The resist pattern is a pattern that covers a part of the upper surface of the silicon film PS1 but exposes the upper surface of the silicon film PR1 in other regions. The region where the silicon film PS1 is covered with the photoresist film PR1 corresponds to a region where the control gate electrode CG is formed in a process to be performed later. However, in the present embodiment, a part of the control gate electrode CG is formed to protrude so as to expand in a lateral side (outside) from the region right below the photoresist film PR1.

Next, by performing the first dry etching using the photoresist film PR1 as a mask (etching mask), the upper surface of the silicon film PS1 in the region not covered with the photoresist film PR1 is recessed. Here, the entire film thickness of the silicon film PS1 is not removed, but the upper surface of the silicon film PS1 is trenched down to the middle of the silicon film PS1. That is, even when the first dry etching is performed, the insulating film IF1 is not exposed.

The first dry etching with a comparatively large RF (Radio Frequency) power is performed by using a $CH_2F_2$ (difluoromethane) gas and an $SF_6$ (sulfur hexafluoride) gas as etching gases. Since the dry etching performed under these conditions has a high anisotropic property, the side surface of the silicon film PS1 formed by the recession of the upper surface of the silicon film PS1 in the region exposed from the photoresist film PR1 has an angle that is perpendicular or almost perpendicular to the main surface of the semiconductor substrate SB. That is, the first dry etching is a breakthrough etching process capable of forming a side surface perpendicular to the main surface of the semiconductor substrate SB. Note that the first dry etching corresponds to etching having a comparatively small selection ratio relative to silicon oxide.

In the present embodiment, a distance "b" by which the silicon film PS1 is trenched down in the first dry etching is determined in accordance with a table shown in FIG. 11. In other words, in accordance with the table shown in FIG. 11, the length of the etching time in the first dry etching to be performed for trenching down the silicon film PS1 by the distance "b" is determined. That is, in the first dry etching, the timing at which the etching is to be ended is not determined by the detection of the end point, but the time allocation for the etching time is determined by the time described in the table shown in FIG. 11 so that the etching amount (processing amount, distance "b") is adjusted. The end point detection is a method of determining the timing at which the etching is to be ended by detection of change in a light emitting state at the time of etching through visual check or usage of a sensor or others. By performing the first dry etching, the silicon film PS1 in a region not covered with the photoresist film PR1 is left so as to have a film thickness with a predetermined distance "c".

FIG. 11 shows an example of a table for use in setting the time (breakthrough time) during which the breakthrough etching is performed at the time of processing a control gate electrode to be described later, in accordance with the film thickness "a" of the silicon film PS1. In the table shown in FIG. 11, columns for section 1 to section 5 are described in the lateral direction, and respective columns for a product A, a product B and a product C having different characteristics from one another are described in the longitudinal direction. The product A, the product B and the product C are products (semiconductor chips) on which memories having different characteristics from one another are mounted, and are classified in a type of a desired product to be manufactured by the manufacturing process of the semiconductor device.

The product A is a product on which a memory having characteristics of a fast writing operation but a slow erasing operation is mounted because a gate length of a memory gate electrode to be formed later is large. The product B is a product on which a memory having characteristics of an almost-standard-speed writing operation speed and an almost-standard-speed erasing operation speed is mounted because the gate length of the memory gate electrode to be formed later has an almost-standard size that is smaller than that of the product A but larger than that of the product C. The product C is a product on which a memory having characteristics of a slow writing operation but a fast erasing operation is mounted because the gate length of a memory gate electrode to be formed later is small. Moreover, since the gate length of the memory gate electrode is large, the product A has high maintaining characteristics of stored information (hereinafter, sometimes referred to simply as "maintaining (retention) characteristics"), that is, good retention characteristics. On the other hand, since the gate length of the memory gate electrode is small, the product C has low retention characteristics of stored information, that is, poor retention characteristics. Moreover, the product B has retention characteristics that are in the middle between those of the product A and the product C. Note that the standard described here means intermediate characteristics between those of the product A and the product C.

The sections 1 to 5 on the respective lines aligned in the lateral direction of FIG. 11 are sections that are selected in accordance with the film thickness "a" of the silicon film PS1 made so as to form the control gate electrode. The columns from 46 seconds to 54 seconds aligned in a matrix form in FIG. 11 show the etching time for the first dry etching that is set based on combinations between the film thickness "a" and the products A to C to be desirably manufactured. In the present embodiment, the breakthrough time is selected from the line of the section 3 in the table since the value of the film thickness "a" is set to 250 nm as an example. In this case, when it is desirable to manufacture, for example, the product C, the first dry etching explained by using FIG. 2 is performed for 48 seconds. The case of the formation of the product C will be described below.

When the product C is formed in the case in which the film thickness "a" of the silicon film PS1 is, for example, 252.5 nm, note that the first dry etching is performed for 49 seconds in accordance with the section 4 of the table in FIG. 11. In this manner, when the film thickness "a" is comparatively large, the breakthrough time is made longer so that the distance "b" is made larger. Thus, regardless of the size of the film thickness "a", the distance "c" can be set to a desired constant size.

The processes explained by using FIG. 2 are not simultaneously performed to a plurality of wafers, but performed to each of the wafers. That is, the first dry etching is performed by a single wafer processing system. For this reason, even when there is a difference in the value "a" of the film thickness between the wafers, the process (first dry etching) is performed in accordance with the table of FIG. 11, so that the film thickness (distance "c") of the processed silicon film PS1 in each of these wafers can be set to a constant size. Moreover, in both of cases in which the value of the film thickness "a" is the same as one another among the plurality of wafers and in which there is a difference in the film thickness "a" among them, the distance "c" can be made different among each of the wafers by appropriately changing the length of the etching time for the first dry etching in accordance with the characteristics of the product (for example, the product A to the product C) to be desirably manufactured. Thus, memories having different characteristics among the wafers can be also formed.

Successively, as shown in FIG. 3, the second dry etching is performed by using the photoresist film PR1 as a mask, so that the silicon film PS1 (see FIG. 2) that is not covered with the photoresist film PR1 is removed so as to expose the insulating film IF1, and a control gate electrode CG made of the silicon film PS1 is formed. However, at this time, the entire silicon film PS1 that is not covered with the photoresist film PR1 is not removed, but a part of the silicon film PS1 in the vicinity of the region right below the photoresist layer PR1 is left. That is, the lower portion of the side surface of the control gate electrode CG is formed to have a tail shape that expands wider in the lateral direction as the portion comes closer to the semiconductor substrate SB.

In other words, the side surface of the control gate electrode CG is formed of a side surface (first side surface) of an upper portion formed by the first dry etching and a side surface (second side surface) of a lower portion formed by the second dry etching, and the side surface (second side surface) of the lower portion has a tapered shape. The second side surface has a shape that is more distant from the upper surface of the control gate electrode CG in the lateral direction as the shape comes closer from the upper surface side to the lower surface side of the control gate electrode CG. Therefore, the width of the lower surface of the control gate electrode CG in the gate length direction is wider than the width of the upper surface of the control gate electrode CG.

That is, although the width of the control gate electrode CG is constant in the height from the upper end to the lower end of the first side surface, the width of the control gate electrode CG becomes gradually larger from the upper end toward the lower end of the second side surface. That is, the width of the lower portion of the control gate electrode CG becomes wider as the portion comes closer to the lower surface of the control gate electrode CG. In the present application, such a shape of the control gate electrode CG is referred to as a tail shape (taper shape). Note that the lateral direction described here corresponds to a direction along the main surface of the semiconductor substrate SB.

The second dry etching is performed with a middle RF power lower than the RF power of the first dry etching by using a HBr (hydrogen bromide) gas and an $O_2$ (oxygen) gas as etching gases. The dry etching performed under these conditions has a lower anisotropic property and a higher depositing property than those of the first dry etching. That is, during the second dry etching, a part of the removed silicon film PS1 is easily adhered again to the control gate electrode CG. Therefore, the lower portion of the side surface of the control gate electrode CG is formed into a tail shape (taper shape). Thus, the width of the control gate electrode CG in the gate length direction is maximized at the interface at which the control gate electrode CG and the insulating film IF1 are made in contact with each other.

The tail length of the bottom surface of the control gate electrode CG is expressed by a distance "d". The distance (tail length) "d" indicates a protrusion distance of the end of the lower surface of the control gate electrode CG outward from the end of the upper surface of the control gate electrode CG in the gate length direction. In other words, the distance (tail length) "d" means an amount of expansion of the lower end of the control gate electrode CG in the lateral direction on one of the side surfaces on both sides of the control gate electrode CG in the gate length direction. That is, the width of the lower surface of the control gate electrode CG is wider than the width of the upper surface of the control gate electrode CG by the size of "2d". In other words, the size of the distance "d" corresponds to a value of ½ of the difference between the size of the lower surface of the control gate electrode CG and the size of the upper surface of the control gate electrode CG.

Note that the second dry etching is an etching process having a larger selection ratio relative to silicon oxide that that of the first dry etching. For this reason, the end point is detected at the time when the insulating film IF1 made of the silicon oxide film is exposed by the second dry etching, so that the second dry etching can be ended. Therefore, at the time when the second dry etching is ended, the main surface of the semiconductor substrate SB next to the control gate electrode CG is covered with the insulating film IF1.

The amount of the film thickness of the silicon film PS1 to be removed by the second dry etching, that is, the etching amount, is expressed by a distance "c". All of the film thickness "a" and the distances "b" and "c" are distances in a direction (perpendicular direction) perpendicular to the main surface of the semiconductor substrate SB, and a relation among the distances is expressed by "a=b+c".

In the first dry etching explained with reference to FIG. 2, the reason why the etching time is set in accordance with the setting table for the breakthrough time shown in FIG. 11 is because it is desirable to leave the silicon film PS1 having a desired film thickness "c" by the first dry etching regardless of the value of the film thickness "a" of the silicon film PS1 (see FIG. 1) so as to form the control gate electrode CG having a desired tail shape by the subsequent second etching. That is, by performing the dry etching in accordance with the breakthrough time setting table (etching time setting table), it is possible to always terminate the lower end of the first side surface of the side surfaces of the control gate electrode CG at a fixed position, the first side surface having a side surface perpendicular to the main surface of the semiconductor substrate SB. Therefore, since the film thickness (the distance "c") of the silicon film PS1 to be removed by the second dry etching can be prevented from being unexpectedly changed, the control gate electrode CG having a desired tail length "d" can be always formed by the second etching.

The gate length of the control gate electrode CG formed by the first dry etching and the second dry etching in this manner has a size corresponding to the width of the lower surface of the control gate electrode CG in the gate length direction, that is, a size obtained by adding "2d" to the width of the upper surface of the control gate electrode CG. The control gate electrode CG is formed of a pattern whose upper portion has a rectangular cross section and whose lower portion connected to the upper portion has a trapezoidal cross section. The control gate electrode CG extends in a direction along the main surface of the semiconductor substrate SB, the direction being the gate width direction orthogonal to the gate length, that is, in a depth direction in FIG. 3.

The processes explained by using FIG. 3 are not simultaneously performed to a plurality of wafers, but performed to each of the wafers. That is, the second dry etching is performed by a single wafer processing system. For this reason, the control gate electrode CG having the shape and the gate length that are different for each of the wafers can be formed by appropriately changing the etching conditions of the second dry etching in accordance with the characteristics of the product (for example, the product A to the product C) to be desirably manufactured. That is, the inclination of the second side surface of the control gate electrode CG can be made different for each of the wafers. In other words, the tail length "d" of the control gate electrode CG can be changed, the second side surface of the control gate electrode CG can be formed with an angle perpendicular to the main surface of the semiconductor substrate SB, and the second side surface of the control gate electrode CG can be formed so as to have a reversed taper shape as described later in a second embodiment. Therefore, memories having different characteristics among the wafers can be formed.

Figure 4:
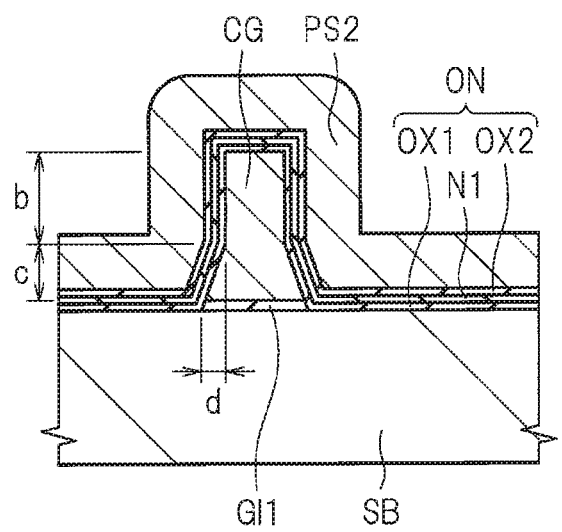
FIG. 4 is a cross-sectional view during a process of manufacturing the semiconductor device, continued from FIG. 3.

Next, as shown in FIG. 4, after the photoresist film PR1 is removed, the insulating film IF1 exposed from the control gate electrode CG is removed by a rinsing (wet etching) process using HF (hydrofluoric acid), so that the main surface of the semiconductor substrate SB is exposed. Thus, a gate insulating film GI1, which is made of the insulating film IF1 located between the lower surface of the control gate electrode CG and the main surface of the semiconductor substrate SB, is formed.

Successively, on the entire main surface of the semiconductor substrate SB, an ONO (oxide-nitride-oxide) film ON serving as a laminated film, a part of which becomes a gate insulating film of a memory transistor, is formed. The ONO film ON covers the upper surface of the semiconductor substrate SB and the side surface and the upper surface of the laminated film made of the gate insulating film GI1 and the control gate electrode CG.

The ONO film ON is an insulating film having a charge storage unit inside this film. More specifically, the ONO film ON is made of a laminated film including a silicon oxide film (bottom oxide film) OX1 formed on the semiconductor substrate SB, a silicon nitride film N1 formed on the silicon oxide film OX1, and a silicon oxide film (top oxide film) OX2 formed on the silicon nitride film N1. The silicon nitride film N1 is a trapping insulating film functioning as a charge storage unit, that is, a charge storage film (charge storage unit).

The silicon oxide film OX1 and the silicon oxide film OX2 can be formed by, for example, an oxidizing method (thermal oxidizing process), a CVD method, or a combination of these methods. For the oxidizing method at this time, an ISSG oxidizing method can be also used. The above-described silicon nitride film N1 can be formed by, for example, a CVD method. Each thickness of the silicon oxide film OX1 and the silicon oxide film OX2 is, for example, about 2 to 10 nm, and the thickness of the above-described silicon nitride film N1 is, for example, about 5 to 15 nm.

Successively, a silicon film (conductive film) PS2 with a predetermined film thickness is formed over the entire main surface of the semiconductor substrate SB so as to cover the surface of the ONO film ON by using, for example, a CVD method. Thus, the side surfaces and upper surface of the exposed ONO film ON are covered with the silicon film PS2. That is, on the side surface of the control gate electrode CG, the silicon film PS2 is formed through the ONO film ON.

In a case of a specific film, the film thickness described here means a thickness of the film in a direction perpendicular to a surface of a base member of the film. For example, when the silicon film PS2 is formed on a surface such as the upper surface of the ONO film ON along the main surface of the semiconductor substrate SB so as to be along the surface, the film thickness of the silicon film PS2 indicates the thickness of the silicon film PS2 in a direction perpendicular to the upper surface of the ONO film ON, that is, the direction perpendicular to the main surface of the semiconductor substrate SB. Moreover, in the case of the silicon film PS2 in a portion in contact with a surface perpendicular to the main surface of the semiconductor substrate SB such as the side surface of the ONO film ON covering the first side surface of the control gate electrode CG, the film thickness of the silicon film PS2 indicates the thickness of the silicon film PS2 in a direction perpendicular to the side surface (the direction being the lateral direction).

In this case, a system (batch system) in which the silicon films PS2 are simultaneously formed on the plurality of wafers is used. That is, in a state in which the plurality of wafers (semiconductor substrates) are set inside one film-forming apparatus, the silicon films PS2 are simultaneously formed on the respective wafers by one film-forming process.

Figure 5:
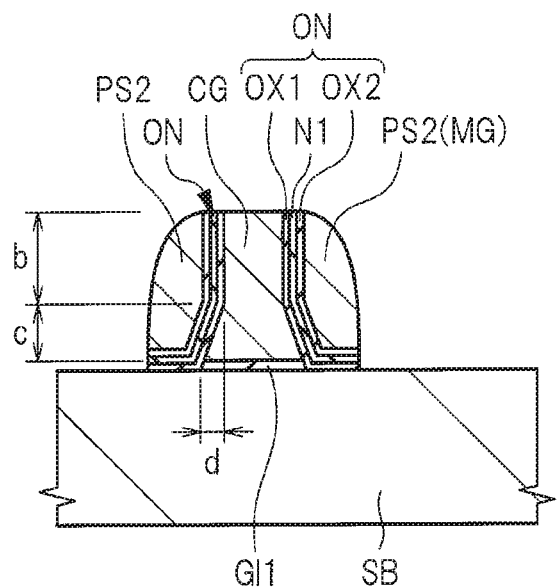
FIG. 5 is a cross-sectional view during a process of manufacturing the semiconductor device, continued from FIG. 4.

Next, as shown in FIG. 5, the silicon film PS2 is etched back by the dry etching method, so that the upper surface of the ONO film ON is exposed. In this case, an upper surface of a part of the ONO film ON in contact with the main surface of the semiconductor substrate SB and the upper surface of the ONO film ON right above the control gate electrode CG are exposed.

In the etching process, the silicon film PS2 is left in a sidewall shape on lateral portions of both of the side surfaces of the laminated film made of the gate insulating film GI1 and the control gate electrode CG through the ONO film ON by performing an anisotropic etching (etching back) process to the silicon film PS2. One of the sidewall-shaped silicon films PS2 left on both of the sides of the laminated film forms a memory gate electrode MG. The memory gate electrode MG is an electrode having a sidewall shape that is formed adjacent to the control gate electrode CG so as to be self-aligned by the dry etching (anistropic etching).

Figure 6:
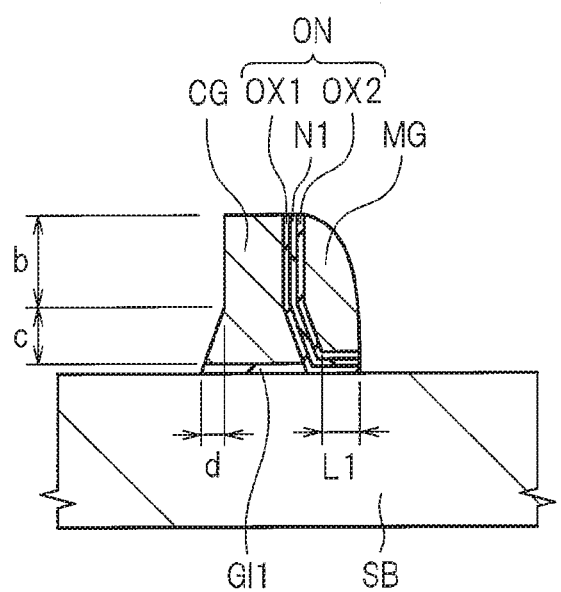
FIG. 6 is a cross-sectional view during a process of manufacturing the semiconductor device, continued from FIG. 5.

Next, as shown in FIG. 6, a photoresist pattern (not shown) is formed on the semiconductor substrate SB by using a photolithography technique, the photoresist pattern covering the memory gate electrode MG adjacent to one of the side surfaces of the control gate electrode CG and exposing the silicon film PS2 adjacent to the other side surface of the control gate electrode CG. Then, by performing an etching process using the photoresist pattern as an etching mask, the silicon film PS2 formed on the opposite side of the memory gate electrode MG across the control gate electrode CG is removed. Then, the photoresist pattern is removed. At this time, the memory gate electrode MG is covered with the photoresist pattern, and therefore, is left without being etched.

Successively, a portion of the ONO film ON, the portion being not covered with the memory gate electrode MG but exposed, is removed by etching (for example, wet etching). At this time, the ONO film ON right below the memory gate electrode MG is left without being removed. Similarly, the ONO film ON located between the memory gate electrode MG and the laminated film including the gate insulating film GI1 and the control gate electrode CG is left without being removed. Since the ONO film ON in other region is removed, the upper surface of the semiconductor substrate SB is exposed, and the upper surface of the control gate electrode CG is exposed. Moreover, one side surface of the control gate electrode CG, the side surface not covered with the memory gate electrode MG, is exposed.

In this manner, the memory gate electrode MG is formed on the semiconductor substrate SB so as to be adjacent to the control gate electrode CG through the ONO film ON having the charge storage unit inside the film. The memory gate electrode MG is formed on the main surface of the semiconductor substrate SB in a region adjacent to the control gate electrode CG through the ONO film ON. In this case, the lower portion (second side surface) of the side surface of the control gate electrode CG has the tail shape so that a part of the control gate electrode CG expands toward the memory gate electrode MG side. For this reason, while a width of the memory gate electrode MG in the gate length direction expands more as it comes closer to the main surface of the semiconductor substrate SB in a portion adjacent to the first side surface of the control gate electrode CG, a width of the same in the gate length direction is made smaller as it comes closer to the main surface of the semiconductor substrate SB in a portion adjacent to the second side surface of the control gate electrode CG. That is, the gate length L1 of the memory gate electrode MG is not the maximum width of the memory gate electrode MG but a width of the lower surface of the memory gate electrode MG, and the gate length L1 is smaller than the maximum width of the memory gate electrode MG.

In various memory cells having different tail lengths "d" from one another, the tail length "d" and the gate length L1 of the memory gate electrode MG have the following relation. For example, when the tail length "d" of the control gate electrode CG is 17 nm, the gate length L1 of the memory gate electrode MG is 59 nm. When the tail length "d" is 20 nm, the gate length L1 is 53 nm. When the tail length "d" is 23 nm, the gate length L1 is 53 nm. In this manner, the sum of the tail length "d" and the gate length L1 is not always constant.

In this case, by collecting the measuring results of the distance "c" and the tail length "d", a database can be created based on empirical rules about the tail length "d" of the control gate electrode CG to be formed when the second dry etching (see FIG. 3) is performed with respect to the silicon film PS1 (see FIG. 2) having a predetermined film thickness (distance "c") under the certain etching conditions. Moreover, by collecting the measuring results of the tail length "d", the film thickness of the silicon film PS2 (see FIG. 4) and the gate length L1, a database can be created based on empirical rules about the gate length L1 obtained in relation to the tail length "d" and the film thickness of the silicon film PS2.

One of the main features of the present embodiment is to control the gate length L1 of the formed memory gate electrode MG, that is influenced by the shape of the control gate electrode CG, by forming the control gate electrode CG having the tail shape, which results in formation of a MONOS memory element having desired characteristics.

Figure 7:
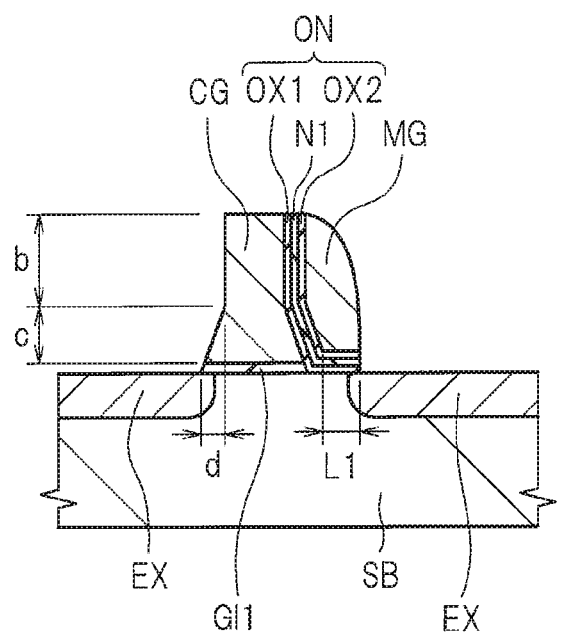
FIG. 7 is a cross-sectional view during a process of manufacturing the semiconductor device, continued from FIG. 6.

Next, as shown in FIG. 7, by performing an ion implantation using the control gate electrode CG as a mask (ion implantation inhibiting mask), a pair of extension regions (impurity diffusion regions, n⁻-type semiconductor regions) EX are formed on the main surface of the semiconductor substrate SB. That is, the extension regions EX are formed by introducing an n-type impurity such as arsenic (As) into the main surface of the semiconductor substrate SB by an ion implantation method.

Figure 8:
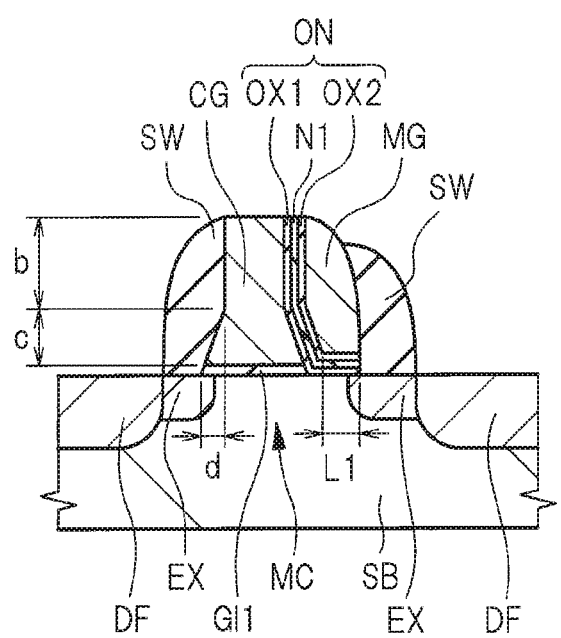
FIG. 8 is a cross-sectional view during a process of manufacturing the semiconductor device, continued from FIG. 7.

Next, as shown in FIG. 8, sidewalls SW serving as insulating films for covering the side surfaces on both sides of a pattern including the gate insulating film GI1, the control gate electrode CG, the ONO film ON and the memory gate electrode MG are formed. The sidewalls SW can be formed so as to be self-aligned by successively forming, for example, a silicon oxide film and a silicon nitride film on the semiconductor substrate SB by using, for example, a CVD method, and then, partially removing the silicon oxide film and silicon nitride film by anisotropic etching so as to expose the main surface of the semiconductor substrate SB and the respective upper surfaces of the control gate electrode CG and the memory gate electrode MG.

That is, one of the paired sidewalls SW is formed so as to be made in contact with the side surface of the memory gate electrode MG, and the other is formed so as to be made in contact with the side surface of the control gate electrode CG. While it is proposed to form the sidewalls SW by a laminated film, an interface between the films forming the laminated film is not illustrated in the drawings.

Successively, by performing an ion implantation using the above-described pattern and the sidewalls SW as masks (ion implantation inhibiting masks), a pair of diffusion regions (impurity diffusion regions, n⁺-type semiconductor regions) DF are formed on the main surface of the semiconductor substrate SB. More specifically, the diffusion regions DF are formed by introducing an n-type impurity (arsenic (As) or phosphorus (P)) into the main surface of the semiconductor substrate SB with a comparatively high concentration by using an ion implantation method.

The extension region EX has a smaller formation depth (junction depth) than that of the diffusion region DF. The extension region EX is formed to be in contact with the diffusion region DF. In the manner as described above, a pair of source/drain regions constituted by the extension region EX and the diffusion layer DF that is a diffusion layer having a higher impurity concentration than that of the extension region EX are formed. That is, the source/drain regions have an LDD (Lightly Doped Drain) structure. The source region has the extension region and the diffusion region DF that are in contact with each other, and the drain region has the extension region and the diffusion region DF that are in contact with each other. Between the paired diffusion regions DF, the paired extension regions EX are formed so as to be spaced from each other.

Next, an activation annealing process is performed, the activation annealing being a heat treatment for activating the impurity introduced into the semiconductor regions (extension region EX, diffusion region DF) or others forming the source region and the drain region. Thus, a control transistor and a memory transistor, and a memory cell MC made of these transistors are formed.

The control gate electrode CG and the paired source/drain regions next to the control gate electrode constitute the control transistor. Moreover, the memory gate electrode MG and the paired source/drain regions next to the memory gate electrode constitute the memory transistor. The control transistor and the memory transistor constitute a memory cell MC of a split-gate-type MONOS memory. A well in the vicinity of the main surface of the semiconductor substrate SB between the paired extension regions EX forms a channel region in which a channel is formed at the time of operation of the memory cell MC.

Figure 9:
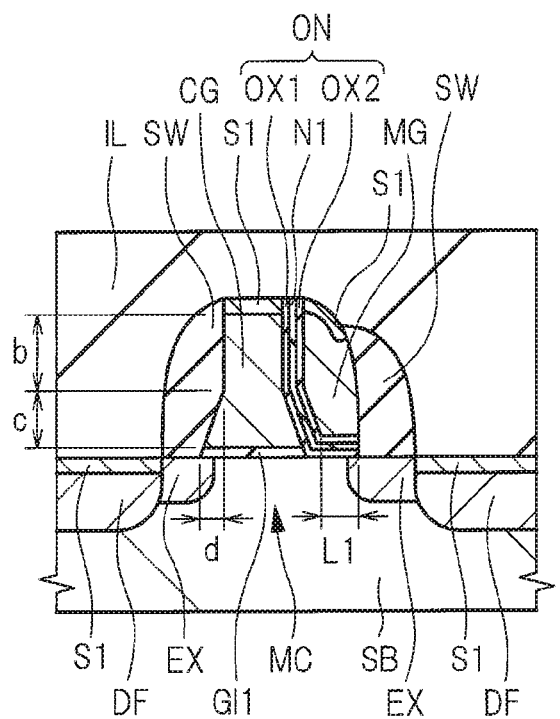
FIG. 9 is a cross-sectional view during a process of manufacturing the semiconductor device, continued from FIG. 8.

Next, as shown in FIG. 9, a silicide layer S1 is formed. The silicide layer S1 can be formed by performing a so-called salicide (Salicide: Self Aligned Silicide) process. More specifically, the silicide layer S1 can be formed as follows.

That is, a metal film for use in forming the silicide layer S1 is formed (deposited) over the entire main surface of the semiconductor substrate SB including the respective upper surfaces of the diffusion region DF, the control gate electrode CG and the memory gate electrode MG. As the metal film, a single metal film (pure metal film) or an alloy film can be used. The metal film is made of, for example, a cobalt (Co) film, a nickel (Ni) film, or a nickel-platinum alloy film, and can be made by using a sputtering method or others.

Then, by performing a heat treatment (heat treatment for forming the silicide layer S1) to the semiconductor substrate SB, reaction of the respective surface layer portions of the diffusion region DF, the control gate electrode CG and the memory gate electrode MG with the metal film is caused. Thus, the silicide layer S1 is formed so as to be made in contact with the respective upper surfaces of the diffusion region DF, the control gate electrode CG and the memory gate electrode MG. Then, the unreacted portions of the metal film are removed by wet etching or others so that a configuration as shown in FIG. 9 is obtained. The silicide layer S1 can be formed as, for example, a cobalt silicide layer, a nickel silicide layer, or a nickel-platinum silicide layer.

Successively, over the entire main surface of the semiconductor substrate SB, an interlayer insulating film IL is formed so as to cover the memory cell MC. The interlayer insulating film IL is made of, for example, a single film of a silicon oxide film, and can be formed by using, for example, a CVD method or others. In this case, the interlayer insulating film IL is formed with a film thickness that is, for example, thicker than the film thickness of the control gate electrode CG. Successively, the upper surface of the interlayer insulating film IL is polished by using a CMP (Chemical Mechanical Polishing) method or others.

Figure 10:
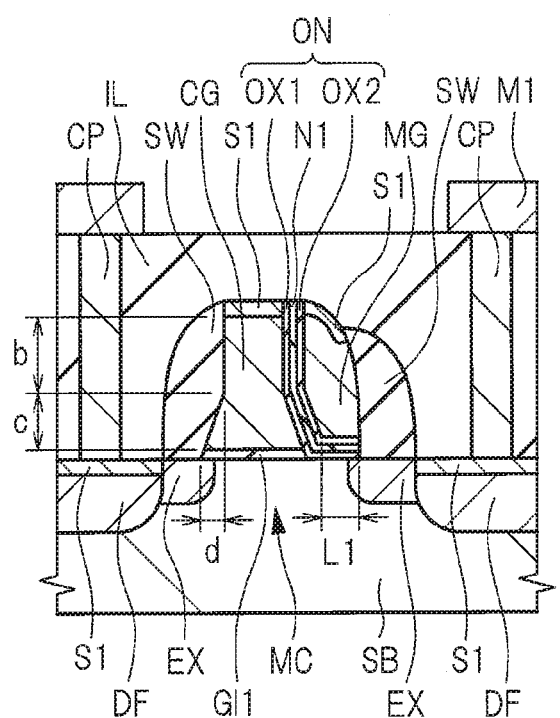
FIG. 10 is a cross-sectional view during a process of manufacturing the semiconductor device, continued from FIG. 9.

Next, as shown in FIG. 10, the interlayer insulating film IL is dry-etched by using the photoresist pattern (not shown) formed on the interlayer insulating film IL as an etching mask by a photolithography technique. Thus, a plurality of contact holes (openings, through holes) that penetrate the interlayer insulating film IL are formed.

From the bottoms of the respective contact holes, the upper surface of the silicide layer S1 on the surface of each of the diffusion regions DF that are parts of the main surface of the semiconductor substrate SB, the upper surface of the silicide layer S1 on the surface of the control gate electrode CG, the upper surface of the silicide layer S1 on the surface of the memory gate electrode MG and others are exposed. The drawing shows only the contact hole right above the diffusion region DF.

Successively, inside the respective contact holes, a plurality of conductive contact plugs CP made of tungsten (W) or others are formed as conductor members for use in connection. In order to form the contact plugs CP, for example, a barrier conductive film (for example, a titanium film, a titanium nitride film or a laminated film of these films) is formed on the interlayer insulating film IL including the inside of the contact hole. Then, after forming a main conductive film made of a tungsten film or others on this barrier conductive film so as to completely fill the inside of each contact hole, unnecessary main conductive films and barrier conductive film outside of the contact hole are removed by a CMP method, an etch back method or others, so that the plurality of contact plugs can be formed.

The plurality of contact plugs CP filled inside the contact holes are electrically connected to the respective upper surfaces of the diffusion region DF, the control gate electrode CG and the memory gate electrode MG through the silicide layer S1. The respective contact plugs CP are connected to the upper surface of the silicide layer S1 on the diffusion region DF, the upper surface of the silicide layer S1 on the diffusion region DF, the upper surface of the silicide layer S1 on the control gate electrode CG, the upper surface of the silicide layer S1 on the memory gate electrode MG, and others.

In order to simplify the drawing, note that FIG. 10 shows the barrier conductive film and the main conductive film (tungsten film) constituting the contact plugs together. Moreover, in the cross-sectional view of FIG. 10, the respective contact plugs CP connected to the control gate electrode CG and the memory gate electrode MG are not shown. In other words, in a region not shown in the drawing, the contact plug CP is connected to each of the control gate electrode CG and the memory gate electrode MG extending in the gate width direction.

Successively, a first wiring layer including a wiring M1 of a first layer is formed on the interlayer insulating film IL in which the contact plug CP is filled. The wiring M1 can be formed by using a so-called single damascene technique. The first wiring layer has an interlayer insulating film (not shown) formed on the interlayer insulating film IL and the wiring M1 of the first layer that penetrates the interlayer insulating film. The bottom surface of the wiring M1 is connected to the upper surface of the contact plug CP. Although the subsequent processes are omitted in the illustrations, a plurality of semiconductor chips are obtained by forming a laminated wiring layer by successively forming a second wiring layer and a third wiring layer on the first wiring layer, and then, individualizing the semiconductor wafer into pieces by a dicing process. In the manner as described above, a semiconductor device of the present embodiment is manufactured.

<Operations of Nonvolatile Memory>

Next, an example of operations of a nonvolatile memory will be described with reference to FIG. 32. FIG. 32 is a table that shows an example of voltage applying conditions to the respective parts of a selective memory cell at the time of each of "writing", "erasing" and "reading" operations according to the present embodiment. In each of the "writing", "erasing" and "reading" operations, the table of FIG. 32 shows a voltage Vmg to be applied to the memory gate electrode MG of the memory cell MC, a voltage Vs to be applied to the source region, a voltage Vcg to be applied to the control electrode CG, a voltage Vd to be applied to the drain region and a base voltage Vb to be applied to the p-type well on the upper surface of the semiconductor substrate as shown in FIG. 10.

The selective memory cell described here indicates a memory cell selected as an object on which the "writing", "erasing" or "reading" operation is performed. In the example of the nonvolatile memory shown in FIG. 10, note that the extension region EX and the diffusion region DF formed in the activation region on the memory gate electrode MG side of each of the memory cells constitute the source region, and the extension region EX and the diffusion region DF formed in the activation region on the control gate electrode CG side thereof constitute the drain region.

Note that a preferable example of the voltage application conditions is shown in the table of FIG. 32, and the conditions are not limited to this example and can be variously modified if necessary. Moreover, in the present embodiment, injection of electrons into the silicon nitride film N1 serving as the charge storage unit in the ONO film ON (see FIG. 10) of the memory transistor is defined as the "writing" operation, and injection of holes thereto is defined as the "erasing" operation.

Moreover, in the table of FIG. 32, a column A corresponds to a case of an SSI mode as the writing method and a BTBT mode as the erasing method, a column B corresponds to a case of the SSI mode as the writing method and an FN mode as the erasing method, a column C corresponds to a case of the FN mode as the writing method and the BTBT mode as the erasing method, and a column D corresponds to a case of the FN mode as the writing method and the FN mode as the erasing method.

The SSI mode is regarded as an operation method of performing the writing operation to the memory cell by injecting hot electrons into the silicon nitride film N1, the BTBT mode is regarded as an operation method of performing the erasing operation to the memory cell by injecting hot holes into the silicon nitride film N1, and the FN mode is regarded as an operation method of performing the writing or the erasing operation by tunneling of electrons or holes. When the FN mode is explained by another expression, the writing of the FN mode is regarded as an operation method of performing the writing operation to the memory cell by injecting electrons into the silicon nitride film N1 based on an FN tunneling effect, and the erasing of the FN mode is regarded as an operation method of performing the erasing operation to the memory cell by injecting holes into the silicon nitride film N1 based on the FN tunneling effect. The following is a specific explanation.

The writing mode includes a writing mode (hot electron injection writing mode) of performing the writing operation by injection of hot electros based on a source-side injection referred to as the so-called SSI (Source Side Injection) mode and a writing mode (tunneling writing mode) of performing the writing operation based on FN (Fowler Nordheim) tunneling referred to as the so-called FN mode.

In the SSI mode writing operation, the writing operation is performed by applying, for example, voltages (Vmg=10 V, Vs=5 V, Vcg=1 V, Vd=0.5 V, Vb=0 V) shown in the "writing operation voltage" of the column A or column B in the table of FIG. 32 to the respective portions of the selective memory cell to which the writing operation is to be performed and injecting the electrons into the silicon nitride film N1 in the ONO film ON in the selective memory.

At this time, hot electrons are generated in a channel region (between the source and the drain) below a gap between two gate electrodes (the memory gate electrode MG and the control gate electrode CG), and the hot electrons are injected into the silicon nitride film N1 serving as the charge storage unit below the memory gate electrode MG. The injected hot electrons (electrons) are captured at a trap level in the silicon nitride film N1 in the ONO film ON. As a result, the threshold voltage of the memory transistor is raised. That is, the memory transistor is set to a writing state.

In the FN mode writing operation, the writing operation is performed by applying, for example, voltages (Vmg=−12 V, Vs=0 V, Vcg=0 V, Vd=0 V, and Vb=0 V) shown in the "writing operation voltage" of the column C or the column D in the table of FIG. 32 to the respective parts of the selective memory cell to which the writing operation is performed, tunneling the electrons from the memory gate electrode MG in the selective memory cell, and injecting the electrons into the silicon nitride film N1 in the ONO film ON. At this time, the electrons are tunneled through the silicon oxide film (top oxide film) OX2 from the memory gate electrode MG because of the FN tunneling (FN tunneling effect), are injected into the ONO film ON, and are captured at the trap level in the silicon nitride film N1 in the ONO film ON. As a result, the threshold voltage of the memory transistor is raised. That is, the memory transistor is set to a writing state.

In the FN mode writing operation, the writing operation can be also performed by causing the tunneling of the electrons from the semiconductor substrate SB and the injection of the electrons into the silicon nitride film N1. The writing operation voltages in this case can be obtained by, for example, inverting positive/negative signs of the "writing operation voltages" in the column C or the column D of the table of FIG. 32.

The erasing method includes an erasing mode (hot hole injection erasing mode) of performing the erasing operation by hot hole injection based on a BTBT (Band-To-Band Tunneling phenomenon) referred to as a so-called BTBT mode and an erasing mode (tunneling erasing mode) of performing the erasing operation by FN (Fowler Nordheim) tunneling referred to as a so-called FN mode.

In the BTBT mode erasing operation, the erasing operation is performed by injecting the holes (positive holes) generated by BTBT into the charge storage unit (silicon nitride film N1). For example, voltages (Vmg=−6 V, Vs=6 V, Vcg=0 V, Vd=open, and Vb=0 V) shown in the "erasing operation voltage" of the column A or the column C in the table of FIG. 32 are applied to the respective parts of the selective memory cell to which the erasing operation is performed. Thus, by generating the holes by the BTBT phenomenon and accelerating the holes by an electric field, the holes are injected into the silicon nitride film N1 in the selective memory cell, so that the threshold voltage of the memory transistor is reduced. That is, the memory transistor is set to an erasing state.

In the FN mode erasing operation, the erasing operation is performed by applying, for example, voltages (Vmg=12 V, Vs=0 V, Vcg=0 V, Vd=0 V, and Vb=0 V) shown in the "erasing operation voltage" of the column B or the column D in the table of FIG. 32 to the respective parts of the selective memory cell to which the erasing operation is performed, tunneling the holes from the memory gate electrode MG in the selective memory cell, and injecting the holes into the silicon nitride film Ni. At this time, the holes are tunneled through the silicon oxide film (top oxide film) OX2 from the memory gate electrode MG because of the FN tunneling (FN tunneling effect), are injected into the ONO film ON, and are captured at the trap level in the silicon nitride film N1 in the ONO film ON. As a result, the threshold voltage of the memory transistor is dropped. That is, the memory transistor is set to an erasing state.

In the FN mode erasing operation, note that the erasing operation can be also performed by causing the tunneling of the holes from the semiconductor substrate SB and the injection of the holes into the silicon nitride film N1. The erasing operation voltages in this case can be obtained by, for example, inverting positive/negative signs of the "erasing operation voltages" in the column B or the column D of the table of FIG. 32.

At the time of reading, for example, voltages shown in the "reading operation voltage" of the column A, the column B, the column C or the column D in the table of FIG. 32 are applied to the respective parts of the selective memory cell to which the reading operation is performed. The writing state and the erasing state can be distinguished from each other by setting the voltage Vmg, that is to be applied to the memory gate electrode MG at the time of reading, to have a value between the threshold voltage of the memory transistor in the writing state and the threshold voltage thereof in the erasing state.

<Effects of Method of Manufacturing Semiconductor Device of the Present Embodiment>

Figure 33:
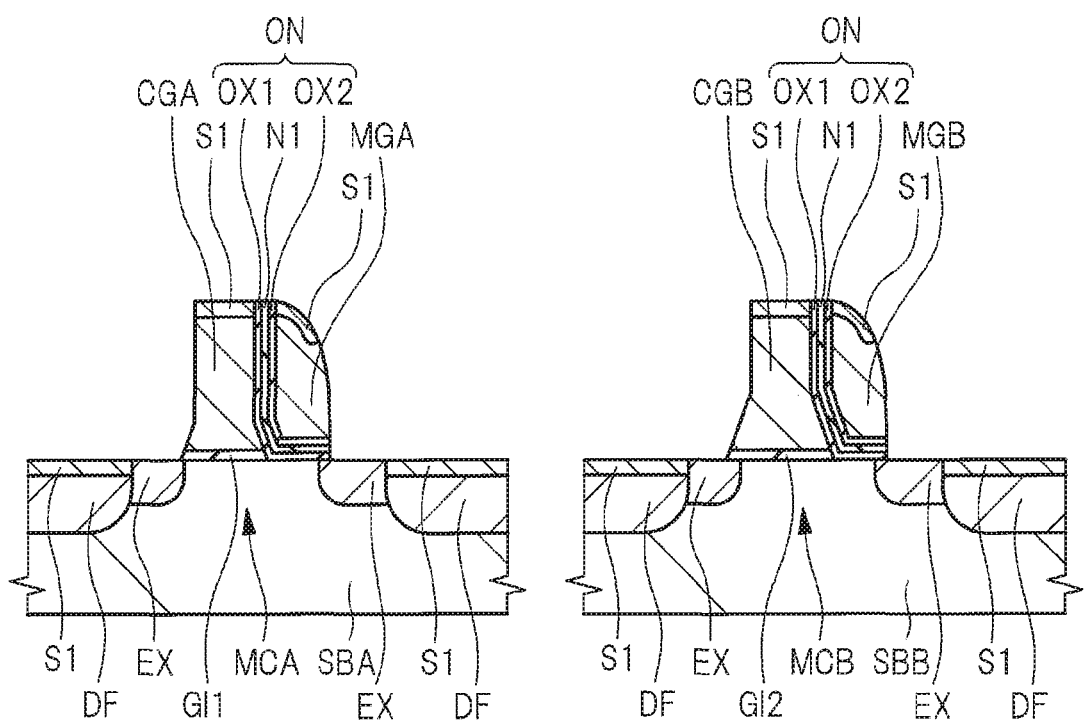
FIG. 33 is a cross-sectional view of a semiconductor device according to a comparative example.

Hereinafter, problems of a semiconductor device of a comparative example shown in FIG. 33 will be described, and effects of the present embodiment will be described. FIG. 33 is a cross-sectional view showing a semiconductor device according to the comparative example.

In the split-gate-type MONOS memory, the gate length of the memory gate electrode significantly affects the writing speed, the erasing speed and the retention characteristics of information in the memory. For example, a memory having a large gate length of the memory gate electrode has characteristics of a high writing speed, a low erasing speed and a good retention property. On the other hand, a memory having a small gate length of the memory gate electrode has characteristics of a low writing speed, a high erasing speed and a poor retention property.

At this time, in the course of manufacturing the split-gate-type MONOS memory, the present inventors of the present invention have found that the thinner the film thickness of the silicon film to be formed for forming the memory gate electrode is, the larger the defective rate of the product is, found that the higher the threshold voltage of the control transistor is, the larger the defective rate of the product is, and found that the lower the threshold voltage of the memory transistor is, the larger the defective rate of the product is. When the present inventors have studied the causes of the increase in the defective rate, the present inventors have found that the gate length of the memory gate electrode which is one of main factors for determining the memory characteristics causes the increase or the decrease depending on a change in the shape of the control gate electrode, and found that such increase or decrease in the value of the gate length of the memory gate electrode causes the above-described increase in the defective rate. Note that a defective product indicates, for example, a semiconductor chip on which a memory not having a desired writing speed, a desired erasing speed or a desired retention characteristics is mounted.

The main reason why the shape of the control gate electrode is unexpectedly changed is that, when the control gate electrode is formed by etching, the control gate electrode is formed by processing the silicon film by combining etching having a high anistropic property with etching having a low anistropic property that is performed after the above-described etching.

That is, since the etching having a high anistropic property is etching having a low selection ratio relative to silicon oxide, it is difficult to end the etching at a desired timing. Therefore, the control gate electrode is processed by performing the etching having a high anisotropic property, and then, further performing the etching having a high selection ratio relative to silicon oxide and a low anisotropic property. Such etching having a low anisotropic property becomes a cause of the tail shape of the lower portion of the side surface of the control gate electrode, When the etching amount caused by the etching having a high anistropic property and the etching amount caused by the etching having a low anistropic property are not controlled, the tail length of the lower portion of the control gate electrode is unexpectedly changed. As a result, the gate length of the memory gate electrode is changed, and therefore, the defective rate increases.

FIG. 33 shows a semiconductor device of a comparative example caused when the gate length of the memory gate electrode is changed by variation in the shape of the control gate electrode. FIG. 33 is a cross-sectional view showing two semiconductor devices serving as comparative examples. In FIG. 33, a semiconductor substrate SBA and a semiconductor substrate SBB that are different wafers from each other are shown side by side. Moreover, in FIG. 33, illustrations of the sidewalls, contact plugs, interlayer insulating film, wirings and others are omitted. The following is an explanation about a case of manufacturing of each semiconductor device so that a memory cell MCA above the semiconductor substrate SBA and a memory cell MCB above the semiconductor substrate SBB are formed as elements having the same characteristics as each other.

Even in an attempt to form the elements having the same characteristics above the semiconductor substrate SBA and the semiconductor substrate SBB, there is a difference in the memory characteristics between the split-gate-type memory cell MCA and the split-gate-type memory cell MCB formed on the different wafers in some cases. This is because each of the control gate electrodes CGA and CGB is formed by performing the etching having a low anisotropic property after the etching having a high anisotropic property as described above in order to end the etching at a desired timing in the formation of the control gate electrodes CGA and CGB by processing the silicon films.

In this case, even when the respective film thicknesses of the silicon films formed on the semiconductor substrate SBA and the semiconductor substrate SBB are the same as each other, there is a difference between time (breakthrough time) during which the dry etching having a high anisotropic property is performed to the silicon film on the semiconductor substrate SBA and time (breakthrough time) during which the dry etching having a high anisotropic property is performed to the silicon film on the semiconductor substrate SBB. For this reason, the etching amount of dry etching having a low anisotropic property performed to the silicon film on the semiconductor substrate SBA in the succeeding process is made smaller than the etching amount of dry etching having a low anisotropic property performed to the silicon film on the semiconductor substrate SBB.

As a result, the tail length of the tail shape formed in the lower portion of the side surface of the control gate electrode CGA is made smaller than the tail length of the tail shape formed in the lower portion of the side surface of the control gate electrode CGB, and therefore, there is a difference in a cross-sectional shape between the control gate electrode CGA and the control gate electrode CGB. Thus, the gate length of the memory gate electrode MGA formed so as to be adjacent to the side surface of the control gate electrode CGA in the succeeding process is made larger than the gate length of the memory gate electrode MGB formed so as to be adjacent to the side surface of the control gate electrode CGB. As described above, when the respective etching times of two types of the dry etching to be performed for forming the control gate electrodes CGA and CGB are not controlled, there is an unexpected difference in the gate length of the memory gate electrode to be formed. For this reason, a problem of variation in the memory characteristics between the memory cells MCA and MCB arises, and therefore, a product on which a memory cell not having desired characteristics is mounted is regarded as defective. Consequently, problems of reduction in reliability of the semiconductor device and reduction in an yield of the semiconductor device arise.

Accordingly, the present inventors have studied a manufacturing method for achieving a semiconductor device provided with a memory having desired characteristics by controlling the shape of the control gate electrode CG.

In the present embodiment, as the manufacturing method, a first dry etching is performed by selecting the breakthrough time for use in vertically processing the control gate electrode in accordance with the film thickness "a" of the first silicon film formed for forming the control gate electrode based on the etching time setting table shown in FIG. 11, and then, a second dry etching is performed so that the lower portion of the side surface of the control gate electrode is formed into the tail shape. Thus, the distance "c" that is the height of the side surface in which the tail shape is formed by the second dry etching can be controlled so as to have a desired size. That is, the tail shape of the control gate electrode can be controlled. Thus, in the succeeding process, a sidewall-shaped memory gate electrode having a desired gate length can be formed in a region adjacent to the side surface of the control gate electrode.

More specifically, in the process explained with reference to FIG. 2, the first dry etching is performed by selecting the breakthrough time for use in vertically processing the silicon film PS1 in accordance with the film thickness "a" of the silicon film PS1 based on the etching time setting table. Thus, the etching amount of the first dry etching can be controlled so that the silicon film PS1 has a desired film thickness (distance "c"). That is, the etching amount caused by the successively-performed second dry etching is always the distance "c". Since the etching amount of the second dry etching can be controlled as described above, the tail length "d" of the lower portion of the side surface of the control gate electrode CG (see FIG. 3) can be controlled. That is, time allocation for each of the first dry etching and the second dry etching is managed and controlled, so that the gate length L1 of the sidewall-shaped memory gate electrode MG (see FIG. 6) formed in the succeeding process can be controlled to a desired value.

Therefore, since the unexpected change in the value of the gate length L1 of the memory gate electrode MG can be prevented, the defective rate of the semiconductor device on which the MONOS memory is mounted can be reduced. Thus, the reliability of the semiconductor device can be improved. Moreover, the yield of the semiconductor device can be improved.

Furthermore, if the memories having the different characteristics from each other can be differently formed between a predetermined wafer and other wafers, the desired number of wafers on each of which the memories with the predetermined characteristics are mounted can be manufactured, and therefore, the productivity of the semiconductor device can be improved. In this case, the size of the gate length of the sidewall-shaped memory gate electrode that is formed to be self-aligned is affected by, for example, the film thickness of the silicon film to be formed in order to form the memory gate electrode. That is, when the film thickness of the silicon film is large, the gate length of the memory gate electrode is also large.

Therefore, as a method of differently forming the memory gate electrodes having the different gate lengths from each other between the different wafers as described above, a method of forming the memory gate electrodes having the different gate lengths from each other is proposed, the method being performed by depositing the silicon films having different film thicknesses on the wafers and performing the anisotropic etching processes to the silicon films.

However, when a film-forming process is simultaneously performed to all of a large number of wafers that are set in a furnace of one film-forming device, that is, when a batch-type film-forming process is performed, the productivity of the semiconductor device can be enhanced. However, the silicon film for use in forming the memory gate electrode cannot be formed so as to have a different film thickness for each of the wafers. That is, the formation of the silicon film having the different film thickness for each of the wafers has problems of the lower productivity of the semiconductor device and a larger manufacturing cost of the semiconductor device than those of the formation of the silicon film having the same film thickness among a large number of wafers in the batch system.

Moreover, when the thickness of the silicon film to be formed for forming the memory gate electrode is excessively thick in order to increase the gate length of the memory gate electrode, the cross-sectional area of the memory gate electrode increases to reduce the resistivity of the memory gate electrode, so that a problem of unexpected variation in the characteristics of the semiconductor device arises. Furthermore, when the thickness of the silicon film to be formed for forming the memory gate electrode is excessively thin in order to reduce the gate length of the memory gate electrode, problems of difficulty in the formation of the silicide layer on the upper surface of the memory gate electrode and the connection of the contact plug to the silicide layer arise. In other words, the semiconductor device does not normally operate. Moreover, since the distance between the memory cells is made small, for example, short circuit easily occurs between the adjacent memory gate electrodes. In order to avoid these problems, it is required to redesign the semiconductor device. As a result, the manufacturing cost of the semiconductor device increases.

On the other hand, in the method of manufacturing the semiconductor device of the present embodiment, the tail shape of the control gate electrode CG can be controlled by controlling the length of the etching time at the time of processing the silicon film PS1 (see FIG. 1) for use in forming the control gate electrode CG (see FIG. 3), so that the gate length L1 of the memory gate electrode MG (see FIG. 6) that is formed after the formation of the control gate electrode CG can be controlled. That is, in the present embodiment, the control gate electrode CG is formed by the single wafer process regardless of whether or not the method of forming the silicon film PS2 (see FIG. 4) to be deposited to form the memory gate electrode MG on each of the plurality of wafers is the batch system. Therefore, by controlling the etching amounts (the allocation of the etching time) of the two-type etching processes to be performed for forming the control gate electrode CG, the gate length L1 of the memory gate electrode MG can be separately controlled for each of the wafers.

This means that the memory gate electrodes having the different desired gate lengths from one another can be differently formed among the wafers. Therefore, since the required number of wafers on each of which a desirably-manufactured product is formed can be obtained, the productivity of the semiconductor device can be improved. That is, various products on which the memories having the characteristics that are different among the products are mounted can be manufactured while preventing the increase in the manufacturing cost of the semiconductor device.

As a specific manufacturing method, it is proposed that the silicon film PS1 (see FIG. 1) having a fixed film thickness is formed on each of two wafers, and then, the first dry etching time to the silicon film PS1 formed on one of the wafers is made longer than the first dry etching time to the silicon film PS1 formed on the other wafer. Thus, the second dry etching time to the silicon film PS1 formed on one of the wafers is made shorter than the second dry etching time to the silicon film PS1 formed on the other wafer. As a result, the control gate electrodes CG (see FIG. 3) having the different tail lengths from each other can be differently formed between the two wafers. Therefore, the sizes of the gate lengths of the memory gate electrodes MG (see FIG. 6) next to these control gate electrodes CG are different from each other.

Moreover, in the present embodiment, it is not required to thicken the film thickness of the silicon film to be formed for forming the memory gate electrode in order to increase the gate length of the memory gate electrode, and it is not required to thin the film thickness of the silicon film to be formed for forming the memory gate electrode in order to reduce the gate length of the memory gate electrode. Therefore, it is possible to prevent the reduction in the resistance of the memory gate electrode caused by the increase of the cross-sectional area of the memory gate electrode, the occurrence of the failure in the formation of the silicide layer on the upper portion of the memory gate electrode, the occurrence of the failure in the connection between the contact plug and the memory gate electrode and the occurrence of the short circuit due to the reduction in the distance between the memory cells.

That is, the memories having the different performances required for product purposes can be formed while maintaining the memory gate electrode at the constant resistance. Therefore, the reliability of the semiconductor device can be improved. Moreover, it is not required to redesign the layout of the semiconductor device or others in order to change the gate length of the memory gate electrode. As a result, the manufacturing cost of the semiconductor device can be reduced.

In the present embodiment, since the memory gate electrode having a small gate length L1 can be formed as shown in FIG. 10, a memory cell MC having characteristics of a low writing speed, a high erasing speed and a poor retention property can be formed. Such a memory cell MC has performances required for a memory to be mounted on a product having the small number of rewriting times of information.

In the memory cell MC of the present embodiment, the control gate electrode CG has the tail shape, and a slope of a corner portion of a border between the lower surface of the memory gate electrode MG and the side surface of the same that is closer to the control gate electrode CG becomes gentle because of influence of this shape, and therefore, the electric field on the corner portion is moderated. Therefore, since the injection efficiency of electrons into the ONO film ON becomes low, the writing speed becomes low. On the other hand, since the corner portion of the memory gate electrode MG is close to the source region, the erasing efficiency is increased, and, as a result, the erasing speed becomes high.

Note that the etching condition setting table in FIG. 11 shows the three columns of the products A to C. However, the products are not limited to these three products, and the number of types of the products to be desirably manufactured can be appropriately increased/decreased. Moreover, the etching condition setting table in FIG. 11 shows the five columns of the sections 1 to 5. However, the sections are not limited to these five sections, and the number of sections can be appropriately increased/decreased. Moreover, although the thickness "a" is classified by a 2-nm interval in the sections 1 to 5, the difference in the film thickness "a" between the adjacent sections can be appropriately changed. By setting the smaller interval between the sections, the processing accuracy of the first dry etching can be improved.

Furthermore, as explained with reference to FIG. 20 to FIG. 23 in a third embodiment to be described later, the memories having the different characteristics can be formed among the semiconductor chips obtained from one wafer by processing the control gate electrode CG while covering the regions where the memories having the different characteristics are formed with a photoresist film.

Second Embodiment

The first embodiment has described, in the case of the laterally-expanding tail shape in the lower portion of the control gate electrode, the reduction in the defective rate of the memory cell and the method of differently forming the memory cells having the different characteristics among the different wafers. The following is the description about the reduction in the defective rate of the memory cell and the method of differently forming the memory cells having the different characteristics among the different wafers in a case of a laterally-shrinking shape in the lower portion of the control gate electrode with reference to FIG. 12 to FIG. 17. FIG. 12 to FIG. 17 are cross-sectional views in the manufacturing processes of the semiconductor device according to the present second embodiment.

Figure 12:
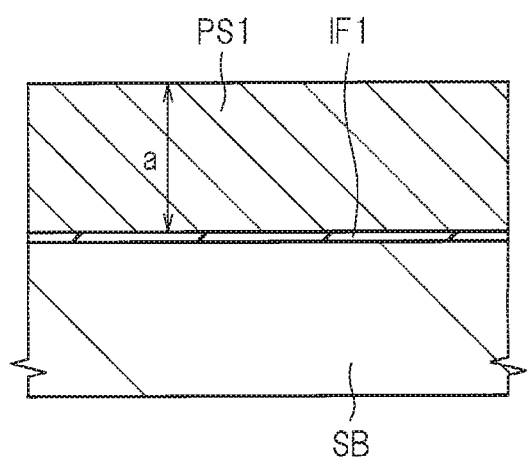
FIG. 12 is a cross-sectional view during a process of manufacturing a semiconductor device according to a second embodiment of the present invention.

In the present embodiment, as shown in FIG. 12, the same processes as those explained with reference to FIG. 1 are performed first to successively, so that an insulating film IF1 and a silicon film PS1 having a film thickness "a" are formed on a semiconductor substrate SB.

Figure 13:
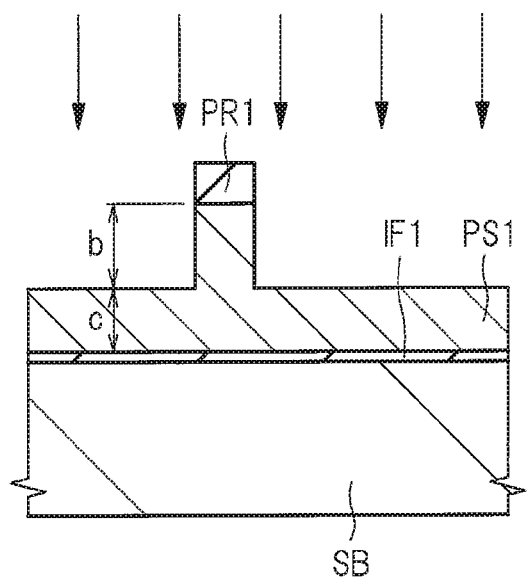
FIG. 13 is a cross-sectional view during a process of manufacturing the semiconductor device, continued from FIG. 12.

Next, as shown in FIG. 13, the same processes as those explained with reference to FIG. 2 are performed, so that a first dry etching is performed while using a photoresist film PR1 as a mask to recess the upper surface of the silicon film PS1 exposed from the photoresist film PR1 by a distance "b". In this first dry etching, as similar to the above-described first embodiment, the length of the etching time is appropriately determined in accordance with the etching time setting table shown in FIG. 11.

Figure 14:
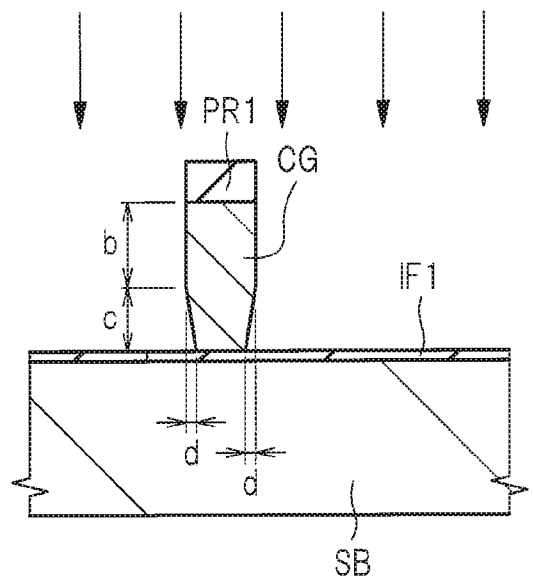
FIG. 14 is a cross-sectional view during a process of manufacturing the semiconductor device, continued from FIG. 13.

Next, as shown in FIG. 14, the second dry etching is performed while using the photoresist film PR1 as a mask, so that a part of the silicon film PS1 (see FIG. 2), the part not being covered with the photoresist film PR1, is removed to expose the insulating film IF1 and form a control gate electrode CG made of the silicon film PS1. However, in this case, all parts of the silicon film PS1, the parts being not covered with the photoresist film PR1, are removed, and besides, a part of the silicon film PS1, the part being right below the photoresist film PR1, is also removed. That is, the lower portion of the side surface of the control gate electrode CG has a reversed taper shape whose lateral width is narrower as the portion comes closer to the semiconductor substrate SB.

In other words, the side surface of the control gate electrode CG is composed of a side surface (first side surface) of an upper portion formed by the first dry etching and a side surface (second side surface) of a lower portion formed by the second dry etching, and the side surface (second side surface) of the lower portion has the reversed taper shape. The second side surface has a shape that comes closer from the first side surface side to the center side of the control gate electrode CG in a lateral direction, as it comes closer from the upper surface side to the lower surface side of the control gate electrode CG. For this reason, the width of the lower surface of the control gate electrode CG in the gate length direction is narrower than the width of the upper surface of the control gate electrode CG.

Since the second side surface has the reversed taper shape, the lower portion of the side surface of the control gate electrode CG is recessed toward the center side of the control gate electrode CG in the gate length direction and is concaved. That is, in the perpendicular direction, no control gate electrode CG is formed between the second side surface of the control gate electrode CG and the main surface of the semiconductor substrate SB so that the lower portion at the end of the control gate electrode CG in the gate length direction has an eave shape. The taper shape described in the present application means a shape that certainly has a region where the control gate electrode CG is positioned right below the second side surface but does not exist right above the second side surface in a case in which a side surface of a predetermined film diagonally tilts against the main surface of the semiconductor substrate SB. Moreover, the reversed taper shape described in the present application means a shape that certainly has a region where the control gate electrode CG is positioned right above the second side surface but does not exist right below the second side surface in a case in which a side surface of a predetermined film diagonally tilts against the main surface of the semiconductor substrate SB.

That is, while the width of the control gate electrode CG is constant in a height from the upper end to the lower end of the first side surface, the width of the control gate electrode CG is gradually smaller from the upper end to the lower end of the second side surface. That is, the width of the lower portion of the control gate electrode CG is narrower as the lower portion comes closer to the lower surface of the control gate electrode CG. In the present application, such a shape of the control gate electrode CG is referred to as a reversed taper shape.

The second dry etching is performed by using a HBr (hydrogen bromide) gas, an $O_2$ (oxygen) gas and a He (helium) gas as etching gases with an RF power that is smaller than both RF powers of the first dry etching and the second dry etching in the above-described first embodiment. The dry etching performed under these conditions has a lower anisotropy than that of the first dry etching, and has a higher depositing property than those of the first dry etching and the second dry etching in the above-described first embodiment. That is, during the second dry etching of the present embodiment, a part of the removed silicon film PS1 is easily adhered onto the control gate electrode CG again. However, since an over-etching process is performed to the silicon film PS1 in this case, the shape of the lower portion of the side surface of the control gate electrode CG is not the tail shape (taper shape) but the reversed taper shape. In other words, as the second dry etching in the present embodiment, a dry etching having characteristics closer to that of isotropic etching than that of the second dry etching in the first embodiment is performed. Therefore, the width of the control gate electrode CG in the gate length direction is minimized at the interface at which the control gate electrode CG and the insulating film IF1 are made in contact with each other.

A recessed width of a bottom surface of the control gate electrode CG is expressed by a distance "d". The distance (recessed width, recessed amount) "d" indicates a distance by which the end of the lower surface of the control gate electrode CG is recessed from the end of the upper surface of the control gate electrode CG toward the center of the control gate electrode CG in the gate length direction. In other words, the distance "d" means a distance by which the lower end of the control gate electrode CG is narrowed in the lateral direction in one of the side surfaces on both sides of the control gate electrode CG in the gate length direction. That is, the width of the lower surface of the control gate electrode CG is narrower than the width of the upper surface of the control gate electrode CG by the size of "2d". In other words, the size of the distance "d" is a value of ½ of a difference between the size of the lower surface of the control gate electrode CG and the size of the lower surface of the control gate electrode CG.

Note that the second dry etching is an etching process having a larger selection ratio relative to silicon oxide than that of the first dry etching and the second dry etching in the first embodiment. For this reason, the end point of the etching is detected at the time when the insulating film IF1 made of the silicon oxide film is exposed by the second dry etching, so that the second dry etching can be ended. Therefore, at the time of the end of the second dry etching, the main surface of the semiconductor substrate SB next to the control gate electrode CG is covered with the insulating film IF1.

The film thickness amount by which the silicon film PS1 is removed in the second dry etching process, that is, the etching amount, is expressed by a distance "c". All of the film thickness "a" and the distances "b" and "c" are distances in a direction (perpendicular direction) perpendicular to the main surface of the semiconductor substrate SB, and a relation among the distances is expressed by "a=b+c".

The reason why the etching time is set in accordance with the setting table for the breakthrough time shown in FIG. 11 in the first dry etching explained with reference to FIG. 2 is because it is desirable to form the control gate electrode CG having a desired reversed taper shape by leaving the silicon film PS1 having a desired film thickness "c" by the first dry etching, and then, performing the second etching, regardless of the value of the film thickness "a" of the silicon film PS1 (see FIG. 1).

The gate length of the control gate electrode CG formed by the first dry etching and second dry etching as described above becomes the width of the lower surface of the control gate electrode CG in the gate length direction, that is, a size obtained by subtracting "2d" from the width of the upper surface of the control gate electrode CG. The control gate electrode CG has a pattern whose upper portion has a rectangular cross section and whose lower portion connected to the upper portion has a trapezoidal cross section having a larger upper base than a lower base. The second dry etching is performed by the single-wafer process system.

Figure 15:
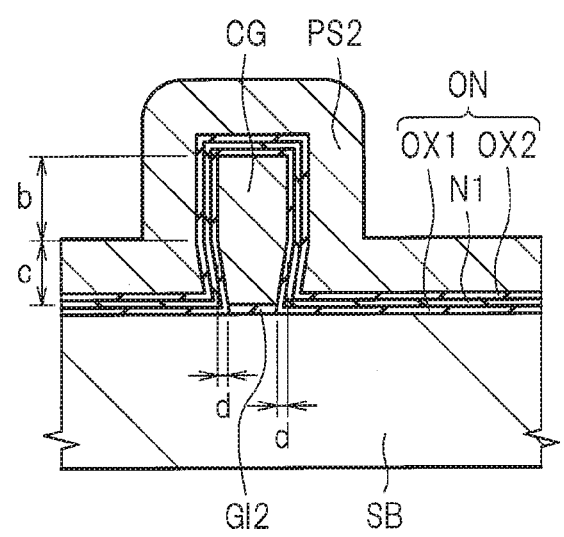
FIG. 15 is a cross-sectional view during a process of manufacturing the semiconductor device, continued from FIG. 14.

Next, as shown in FIG. 15, the same processes as those explained with reference to FIG. 4 are performed, so that a gate insulating film GI2 made of the insulating film IF1 located between the lower surface of the control gate electrode CG and the main surface of the semiconductor substrate SB is formed.

Next, an ONO film ON and a silicon film (conductive film) PS2 are successively formed on the entire main surface of the semiconductor substrate SB. At this time, a laminated film made of the ONO film ON and the silicon film PS2 is formed so as to be embedded inside a concave portion (recessed portion) between the second side surface of the control gate electrode CG and the main surface of the semiconductor substrate SB. That is, the second side surface and the main surface of the semiconductor substrate SB right below the second side surface are covered with the laminated film. As a result, at least the silicon oxide film OX1 exists right below the second side surface. Moreover, a case of the large recessed width "d" of the second side surface can have a case in which the silicon oxide film OX1 and the silicon nitride film N1 exist right below the second side surface, a case in which the ONO film ON exists below the same, and a case in which the ONO film ON and the silicon film PS2 exist below the same. In this case, a system (batch system) that simultaneously forms the silicon films PS2 on a plurality of wafers is used.

Figure 16:
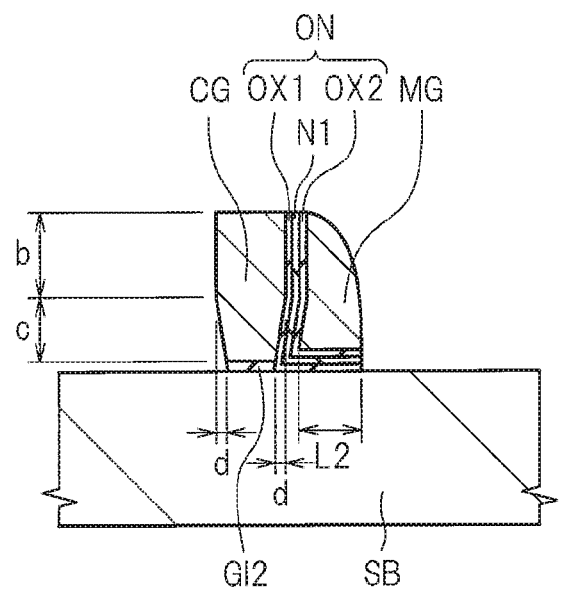
FIG. 16 is a cross-sectional view during a process of manufacturing the semiconductor device, continued from FIG. 15.

Next, as shown in FIG. 16, the processes explained with reference to FIG. 5 and FIG. 6 are performed, so that a sidewall-shaped memory gate electrode MG made of the silicon film PS2 is formed on a side surface of the control gate electrode CG through the ONO film ON so as to be self-aligned. The ONO film ON is interposed between the memory gate electrode MG and the main surface of the semiconductor substrate SB.

In this case, the lower portion (second side surface) of the side surface of the control gate electrode CG has the reversed taper shape, and a part of a laminated film made of the ONO film ON and the memory gate electrode MG is embedded inside a concave portion right below the second side surface, and therefore, a part of the memory gate electrode MG expands toward the control gate electrode CG side. For this reason, the memory gate electrode MG adjacent to the second side surface has a width in the gate length direction at the portion adjacent to the second side surface of the control gate electrode CG, the width being larger as the portion comes closer to the main surface of the semiconductor substrate SB. That is, the gate length L2 of the memory gate electrode MG is the largest width of the memory gate electrode MG and also is the width of the lower surface of the memory gate electrode MG.

One of the main features of the present embodiment is to form the control gate electrode CG having the reversed taper shape, that is to form a MONOS memory element having desired characteristics by controlling the gate length L2 of the memory gate electrode MG formed while being affected by the shape of the control gate electrode CG.

Figure 17:
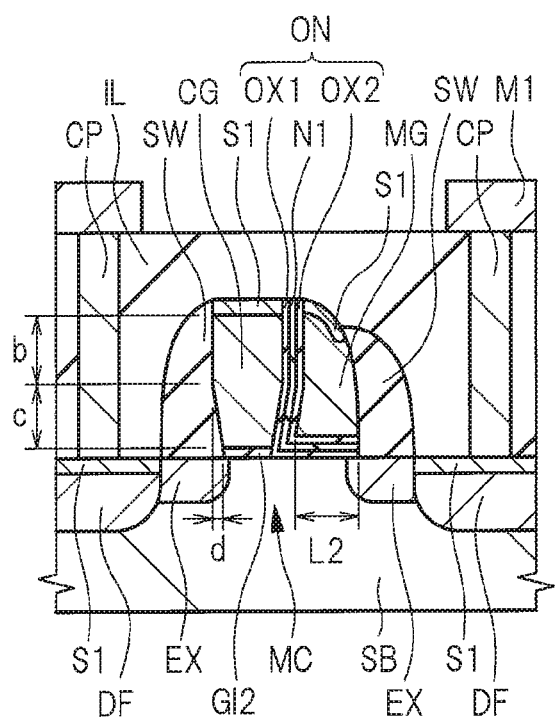
FIG. 17 is a cross-sectional view during a process of manufacturing the semiconductor device, continued from FIG. 16.

Next, as shown in FIG. 17, the same process as the process explained with reference to FIG. 7 to FIG. 10 is performed. Thus, the source/drain regions made of a pair of extension regions EX and a pair of diffusion regions DF are formed, so that a memory cell MC made of a control transistor and a memory transistor is formed. Then, a silicide layer S1, an interlayer insulating film IL, a contact plug CP and a wiring M1 are formed. Then, after forming a laminated wiring layer by successively forming a second wiring layer, a third wiring layer and others, the semiconductor wafer is individualized into pieces by using a dicing process to obtain a plurality of semiconductor chips. As described above, a semiconductor device of the present embodiment is manufactured.

Even when the control gate electrode CG having the reversed taper shape is formed as in the case of the present embodiment, the etching amount is controlled in accordance with the etching time setting table in processing the silicon film PS1 (see FIG. 13 and FIG. 14), so that the gate length L2 of the memory gate electrode MG can be controlled. Therefore, the same effects as those of the first embodiment can be obtained. However, in the present embodiment, the control gate electrode CG having the reversed taper shape is formed so as to expand the gate length L2 of the memory gate electrode MG, and therefore, a memory cell MC having characteristics of, for example, a high writing speed, a low erasing speed and a good retention property such as the product A shown in FIG. 11 can be formed.

As explained in the first embodiment, also in the present embodiment, the memory gate electrodes having the different desired gate lengths among the wafers can be differently formed. In this case, on each of the different wafers, the control gate electrode CG having the reversed taper shapes is formed.

As a specific manufacturing method, a method is proposed, the method of forming a silicon film PS1 (see FIG. 12) having a fixed film thickness on each of two wafers, and then, performing the first dry etching to the silicon film PS1 formed on one of the wafers, the time of which is made longer than time of the first dry etching to the silicon film PS1 on the other wafer. In this manner, the time of the second dry etching to the silicon film PS1 formed on one of the wafers is made shorter than the time of the second dry etching to the silicon film PS1 formed on the other wafer. As a result, between the two wafers, the control gate electrodes CG (see FIG. 14) having the different recessed widths from each other can be differently formed. Therefore, the gate lengths of the memory gate electrodes MG (see FIG. 16) to be formed next to these control gate electrodes CG are different from each other.

In the present embodiment, the memory gate electrode MG having a large gate length L2 can be formed as shown in FIG. 17, and therefore, the memory cell MC having characteristics of the high writing speed, the low erasing speed and the good retention property can be formed. Such a memory cell MC has performances required for a memory that is mounted on a product having a large number of rewriting times of information.

To such a memory cell MC, an electric field is easily concentrated because the corner portions of the memory gate electrode MG acutely protrude toward the control gate electrode CG side. For this reason, in the writing operation, the efficiency for injecting the electrons to the memory gate electrode MG becomes high when the electrons flowing from the drain region are accelerated below the control gate electrode CG and are injected into each of the corner portions of the border between the side surface and the lower surface of the memory gate electrode MG, and therefore, the writing speed becomes high. On the other hand, in the erasing operation, the holes are injected from the source region side into the ONO film ON. At this time, since the corner portions of the memory gate electrode MG where many electrons are accumulated are far from the source region, the erasing efficiency is reduced. Thus, the erasing speed becomes low.

Third Embodiment

Figure 18:
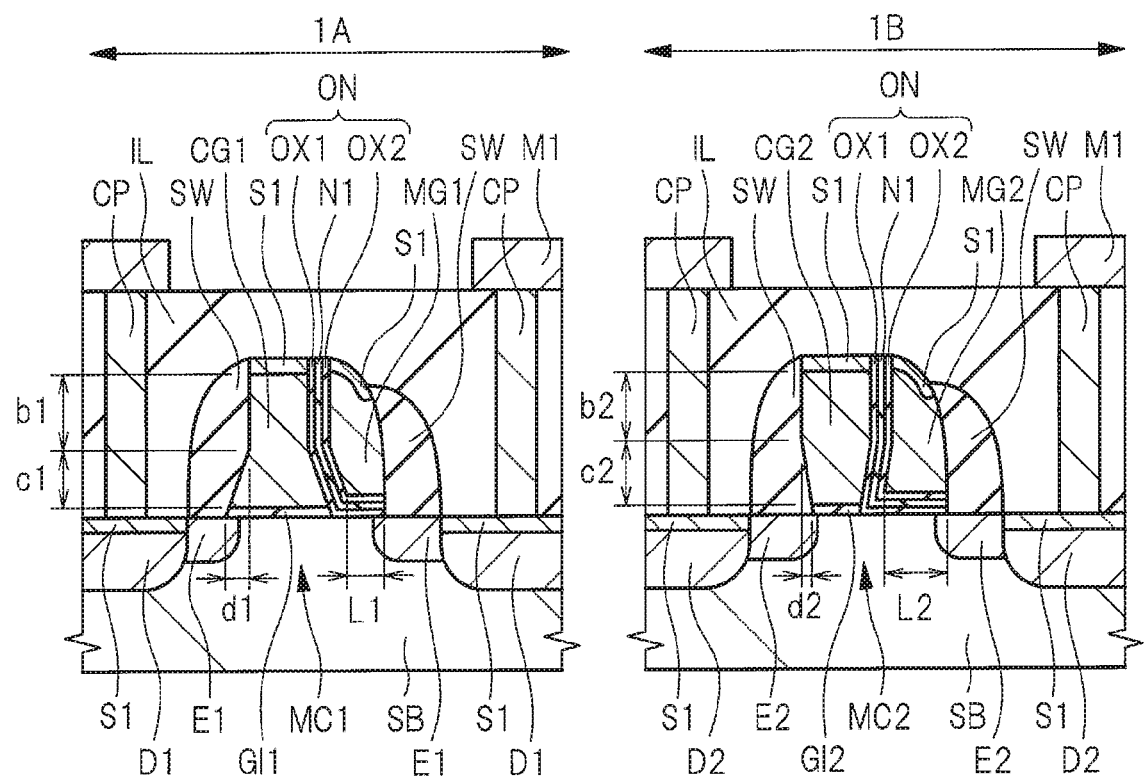
FIG. 18 is a cross-sectional view of a semiconductor device according to a third embodiment of the present invention.

The above-described first and second embodiments have described that the defective rate of memory cells is reduced and that the memory cells having the different characteristics from one another are differently formed among the different wafers. On the other hand, with reference to FIG. 18 to FIG. 27, the following is the description about the mix mounting of the memory cells having the different characteristics on one semiconductor chip. FIG. 18 is a cross-sectional view showing a semiconductor device according to the third embodiment. FIG. 19 to FIG. 27 are cross-sectional views in the processes of manufacturing the semiconductor device according to the present embodiment.

<Configuration of Semiconductor Device>

The semiconductor device of the present embodiment is shown in FIG. 18. In FIG. 18, a first memory cell region 1A is shown on the left side of the drawing and a second memory cell region 1B is shown on the right side of the drawing. The first memory cell region 1A and the second memory cell region 1B are regions that are located on the same semiconductor substrate SB and that are placed side by side along the main surface of the semiconductor substrate SB, and are not overlapped with each other when seen in a plan view. Moreover, both of the first memory cell region 1A and the second memory cell region 1B are regions located on the same semiconductor chip.

The first memory cell region 1A is a region on which a memory is formed, the memory having the small number of times of the rewriting such as about 100 to 1000 times at the maximum so as not to be required to have a high rewriting durability but being required for a high rewriting speed. Moreover, the second memory cell region 1B is a region on which a memory is formed, the memory needing to secure a very high rewriting durability such as about 10,000 to 100,000 times and being required for a high retention property. More specifically, the first memory cell region 1A is a region where a code flash memory is formed, and the second memory cell region 1B is a region where a data flash memory is formed.

As shown in FIG. 18, the semiconductor device of the present embodiment has one semiconductor substrate SB. On the main surface of the semiconductor substrate SB, a p-type well (not shown) and a channel region (not shown) that is a p-type semiconductor region having a shallower formation depth than that of the p-type well are formed. The well and the channel region are regions formed by introducing a p-type impurity (for example, B (boron)) to the main surface of the semiconductor substrate SB.

On the semiconductor substrate SB in the first memory cell region 1A, a control gate electrode CG1 is formed through a gate insulating film GI1. The gate insulating film GI1 is made of, for example, a silicon oxide film, and the control gate electrode CG1 is made of, for example, a polysilicon film. The control gate electrode CG1 is composed of a first portion and a second portion below the first portion. The first portion is a portion having a side surface perpendicular to the main surface of the semiconductor substrate SB and having a rectangular cross-sectional shape, and the second portion a portion having a taper side surface relative to the main surface of the semiconductor substrate SB and having a trapezoidal cross-sectional shape whose lower base is larger than its upper base. In other words, the control gate electrode CG1 has a tail shape (taper shape). Therefore, the width of the second portion of the control gate electrode CG1 in the gate length direction becomes gradually increases from the upper end toward the lower end of the second portion. The thickness of the first portion in the perpendicular direction is expressed by a distance "b1", and the thickness of the second portion in the perpendicular direction is expressed by a distance "c1". Moreover, the tail length of the control gate electrode CG1 is expressed by a distance (tail length) "d1".

Through the ONO film ON, a sidewall-shaped memory gate electrode MG1 is formed on one of both side surfaces of the control gate electrode CG1 in the gate length direction. This ONO film ON is also interposed between the memory gate electrode MG1 and the main surface of the semiconductor substrate SB. The ONO film ON is continuously formed from a portion between the memory gate electrode MG1 and the main surface of the semiconductor substrate SB to a portion between the memory gate electrode MG1 and the control gate electrode CG1. The ONO film ON has a laminated structure in which the silicon oxide film OX1, the silicon nitride film N1 and a silicon oxide film OX2 are successively stacked on the semiconductor substrate SB.

The control gate electrode CG1 has a tail shape, and a side surface of the memory gate electrode MG1 has an almost perpendicular angle, the side surface not facing the side surface of the control gate electrode CG1. Therefore, the width of the memory gate electrode MG1 in the gate length direction at a portion adjacent to the second portion is made smaller as it comes closer to the main surface of the semiconductor substrate SB. At this time, a width of the lower surface of the memory gate electrode MG1 in a short direction corresponds to the gate length L1 of the memory gate electrode MG1.

Sidewalls SW which are insulating films covering side surfaces on both sides of a pattern including the gate insulating film GI1, the control gate electrode CG1, the ONO film ON and the memory gate electrode MG1, are formed on the semiconductor substrate SB. Moreover, a pair of extension regions E1 and a pair of diffusion regions D1 are formed so as to sandwich the main surface (channel region) of the semiconductor substrate SB right below the pattern. In the gate length direction, the extension regions E1 are located at positions closer to the pattern side than the diffusion regions D1. The extension regions E1 and the diffusion regions D1 are n-type semiconductor regions formed by introducing an n-type impurity (for example, arsenic (As) or P (phosphorus)) into the main surface of the semiconductor substrate SB, and the extension regions E1 have an impurity concentration lower than that of the diffusion regions D1. Moreover, the extension regions E1 have a formation depth shallower than that of the diffusion regions D1, and the diffusion regions D1 have a formation depth shallower than that of the well. The extension regions E1 and the diffusion regions D1 constitute the source/drain regions.

The control gate electrode CG1 and the paired source/drain regions next to the control gate electrode constitute a control transistor. Moreover, the memory gate electrode MG1 and the paired source/drain regions next to the memory gate electrode constitute a memory transistor. The control transistor and the memory transistor constitute a memory cell MC1 of a split-gate-type MONOS memory.

On the semiconductor substrate SB in the second memory cell region 1B, a control gate electrode CG2 is formed through a gate insulating film GI2. The gate insulating film GI2 is made of, for example, a silicon oxide film, and the control gate electrode CG2 is made of, for example, a polysilicon film. The control gate electrode CG2 is composed of a third portion and a fourth portion below the third portion. The third portion is a portion having a side surface perpendicular to the main surface of the semiconductor substrate SB and having a rectangular cross-sectional shape, and the fourth portion a portion having a reversed taper side surface relative to the main surface of the semiconductor substrate SB and having a trapezoidal cross-sectional shape whose lower base is smaller than its upper base. In other words, the control gate electrode CG2 has a reversed taper shape. Therefore, the width of the fourth portion of the control gate electrode CG2 in the gate length direction becomes gradually decreases from the upper end toward the lower end of the fourth portion.

The thickness of the third portion in the perpendicular direction is expressed by a distance "b2", and the thickness of the fourth portion in the perpendicular direction is expressed by a distance "c2". Moreover, the recessed width of the control gate electrode CG2 is expressed by a distance "d2".

Through the ONO film ON, a sidewall-shaped memory gate electrode MG2 is formed on one of both side surfaces of the control gate electrode CG2 in the gate length direction. This ONO film ON is also interposed between the memory gate electrode MG2 and the main surface of the semiconductor substrate SB. The ONO film ON is continuously formed from a portion between the memory gate electrode MG2 and the main surface of the semiconductor substrate SB to a portion between the memory gate electrode MG2 and the control gate electrode CG2.

An end of the fourth portion in the lateral direction in the control gate electrode CG2 has a concave portion (eave portion), and a side surface of the memory gate electrode MG2 has an almost perpendicular angle, the side surface not facing the side surface of the control gate electrode CG2. Therefore, the width of the memory gate electrode MG2 in the gate length direction at a portion adjacent to the fourth portion is made larger as it comes closer to the main surface of the semiconductor substrate SB. At this time, a width of the lower surface of the memory gate electrode MG2 in a short direction corresponds to the gate length L2 of the memory gate electrode MG2.

Sidewalls SW which are insulating films covering side surfaces on both sides of a pattern including the gate insulating film GI2, the control gate electrode CG2, the ONO film ON and the memory gate electrode MG2, are formed on the semiconductor substrate SB. Moreover, a pair of extension regions E2 and a pair of diffusion regions D2 are formed so as to sandwich the main surface (channel region) of the semiconductor substrate SB right below the pattern. In the gate length direction, the extension regions E2 are located at positions closer to the pattern side than the diffusion regions D2. The extension regions E2 and the diffusion regions D2 are n-type semiconductor regions formed by introducing an n-type impurity (for example, arsenic (As) or P (phosphorus)) into the main surface of the semiconductor substrate SB, and the extension regions E2 have an impurity concentration lower than that of the diffusion regions D2. Moreover, the extension regions E2 have a formation depth shallower than that of the diffusion regions D2, and the diffusion regions D2 have a formation depth shallower than that of the well. The extension regions E2 and the diffusion regions D2 constitute the source/drain regions.

The control gate electrode CG2 and the paired source/drain regions next to the control gate electrode constitute a control transistor. Moreover, the memory gate electrode MG2 and the paired source/drain regions next to the memory gate electrode constitute a memory transistor. The control transistor and the memory transistor constitute a memory cell MC2 of a split-gate-type MONOS memory.

Moreover, a silicide layer S1 is formed on the respective upper surfaces of the control gate electrodes CG1 and CG2, the memory gate electrodes MG1 and MG2 and the diffusion regions D1 and D2. Furthermore, in the first memory cell region 1A and the second memory cell region 1B, an interlayer insulating film IL made of, for example, a silicon oxide film is formed on the main surface of the semiconductor substrate SB so as to cover the memory cells MC1 and MC2.

Furthermore, a plurality of contact plugs CP serving as connection parts penetrating the interlayer insulating film IL are formed so that each of the contact plugs CP is electrically connected to any of the control gate electrodes CG1 and CG2, the memory gate electrodes MG1 and MG2, and the diffusion regions D1 and D2 through the silicide layer S1. Moreover, on the contact plug CP, a wiring M1 connected to the contact plug CP is formed. The contact plug is mainly made of, for example, W (tungsten), and the wiring M1 is mainly made of, for example, Cu (copper).

As shown in FIG. 18, the gate length L1 of the memory gate electrode MG1 of the memory cell MC1 is smaller than the gate length L2 of the memory gate electrode MG2 of the memory cell MC2. This is because the sidewall-shaped memory gate electrodes MG1 and MG2 are formed on the respective side surfaces of the control gate electrode CG1 having the tail shape and the control gate electrode CG2 having the reversed taper shape so as to be self-aligned thereon.

Therefore, in the semiconductor device according to the present embodiment, a plurality of types of memory cells having the different gate lengths of the memory gate electrodes from one another can be mounted together on the same semiconductor chip. Thus, the memory cells having different characteristics from one another can be formed on the semiconductor chip for each type. Therefore, when the memories required for the different performances from one another are formed, it is not required to separately prepare a semiconductor chip on which a memory having predetermined characteristics is mounted and another semiconductor chip on which a memory having another characteristics is mounted. Therefore, the semiconductor device can be miniaturized. Moreover, a degree of freedom in a layout of the semiconductor device can be enhanced.

<Method of Manufacturing Semiconductor Device>

With reference to FIG. 19 to FIG. 27, a method of manufacturing a semiconductor device according to the present embodiment will be described below. In each of FIG. 19 to FIG. 27, the first memory cell region 1A is shown on the left side of the drawing, and the second memory cell region 1B is shown on the right side of the drawing.

Figure 19:
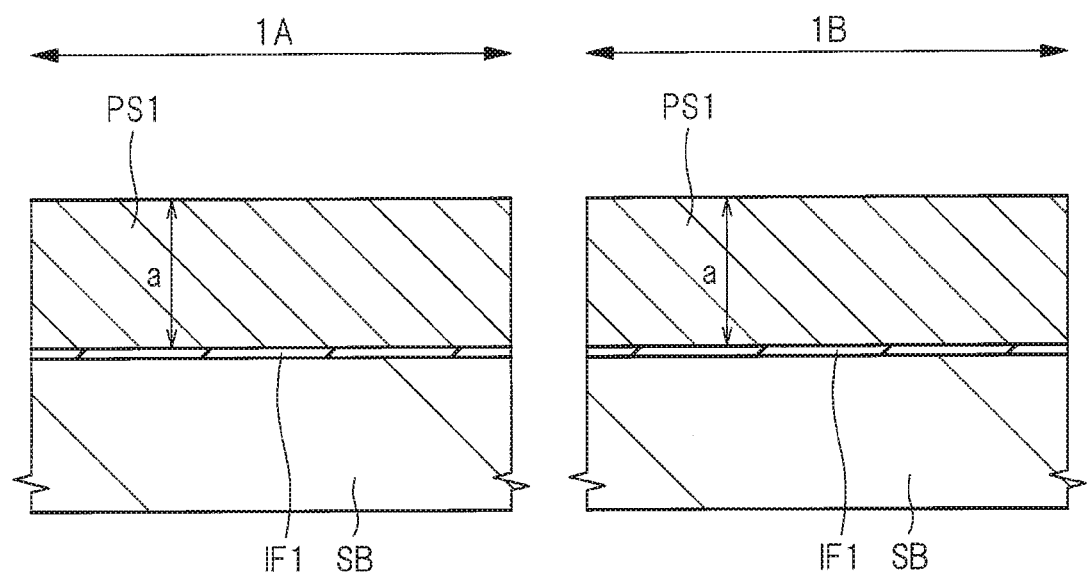
FIG. 19 is a cross-sectional view during a process of manufacturing the semiconductor device according to the third embodiment of the present invention.

In the processes of manufacturing the semiconductor device of the present embodiment, as shown in FIG. 19, first, a semiconductor substrate SB made of a p-type single crystal silicon (Si) or others is prepared. Although not illustrated, an element isolation region is formed on the upper surface of the semiconductor substrate SB. Next, by implanting ions into the main surface of the semiconductor substrate SB, a p-type well (not shown) and a channel region (not shown) are formed on the main surface of the semiconductor substrate SB.

The well and the channel region may be formed in the first memory cell region 1A and the second memory cell region 1B, respectively, at respectively different concentrations from each other. In this case, the impurity concentrations of the channel regions of the first memory cell region 1A and the second memory cell region 1B are adjusted so that the threshold voltage of the transistor formed in the first memory cell region 1A is high and the threshold voltage of the transistor formed in the second memory cell region 1B is low. This is for increasing the rewriting speed of the memory cell formed in the first memory cell region 1A, and for improving the rewriting durability (retention characteristics) of the memory cell formed in the second memory cell region 1B.

Successively, as similar to the processes explained with reference to FIG. 1, an insulating film IF1 and a silicon film PS1 are successively formed in the first memory cell region 1A and the second memory cell region 1B on the semiconductor substrate SB. The silicon film PS1 has a film thickness "a".

Figure 20:
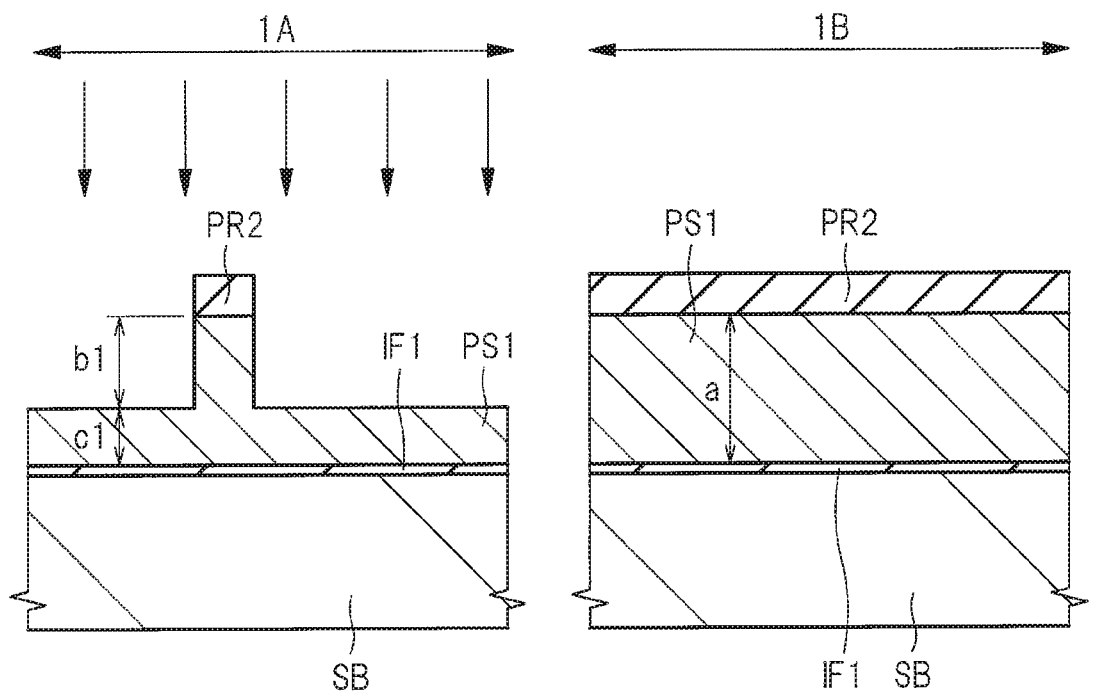
FIG. 20 is a cross-sectional view during a process of manufacturing the semiconductor device, continued from FIG. 19.
Figure 21:
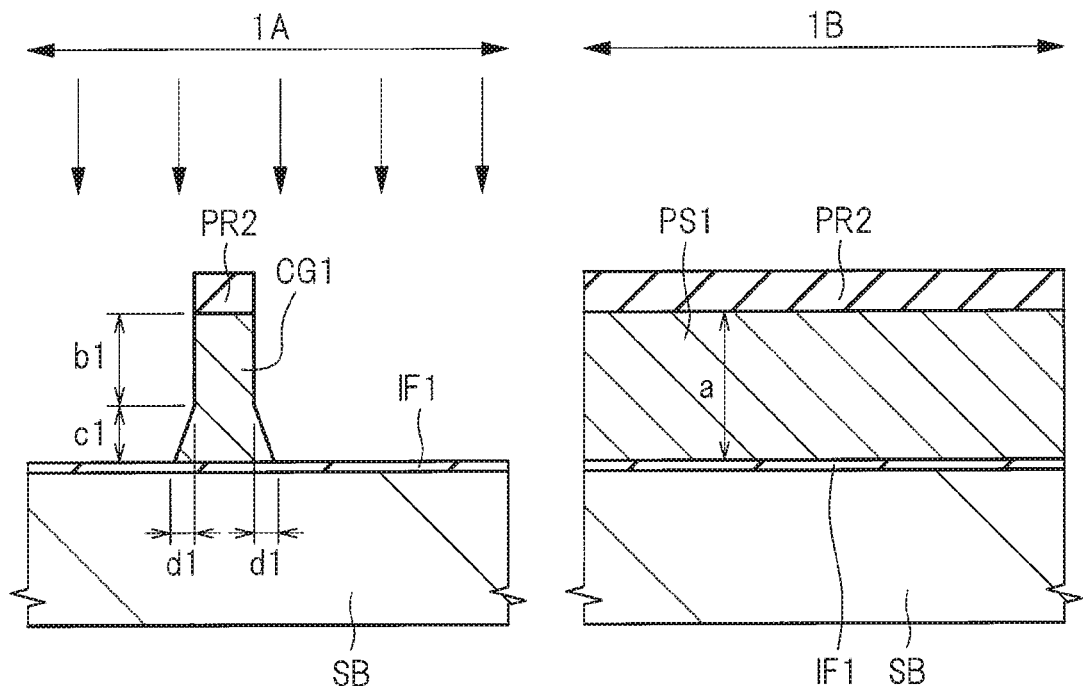
FIG. 21 is a cross-sectional view during a process of manufacturing the semiconductor device, continued from FIG. 20.

Next, as shown in FIG. 20, as similar to the processes explained with reference to FIG. 2, apart of the silicon film PS1 in the first memory cell region 1A is removed by performing the first dry etching (anisotropic etching) using a photolithography technique. Then, as shown in FIG. 21, as similar to the processes explained with reference to FIG. 3, the entire film thickness of the silicon film PS1 in the first memory cell region 1A is removed by performing the second dry etching with the change in the etching conditions, so that a control gate electrode CG1 made of the silicon film PS1 is formed. Purposes for such change in the etching conditions in the middle of the process are to end the etching for forming the control gate electrode CG1 at an appropriate timing and to form only the lower portion of the side surface of the control gate electrode CG1 into the tail shape that expands in the lateral direction.

That is, as shown in FIG. 20, a resist pattern made of a photoresist film PR2 is formed on the upper surface of the silicon film PS1. The resist pattern is a pattern that covers the entire upper surfaces of the silicon film PS1 in the second memory cell region 1B and a part of the upper surface of the silicon film PS1 in the first memory cell region 1A but exposes the upper surfaces of the silicon films PS1 in the other regions.

Next, by performing the first dry etching using the photoresist film PR2 as a mask (etching mask), the upper surface of the silicon film PS1 in the region not covered with the photoresist film PR2 is recessed by a distance "b1". The distance "b1" by which the silicon film PS1 is trenched in the first dry etching process is determined in accordance with the table shown in FIG. 11. By performing the first dry etching, the silicon film PS1 in the region not covered with the photoresist film PR2 is left so as to have a film thickness corresponding to a distance "c". In this case, in order to form a memory cell having characteristics of a low writing speed, a high erasing speed and a poor retention property in the first memory cell region 1A, the length of the etching time of the first dry etching in accordance with the film thickness "a" is determined based on the etching time setting table shown in FIG. 11.

Successively, as shown in FIG. 21, by performing the second dry etching using the photoresist film PR2 as a mask, the silicon film PS1 not covered with the photoresist film PR2 is removed, so that the insulating film IF1 is exposed, and a control gate electrode CG1 made of the silicon film PS1 is formed. The lower portion of the side surface of the control gate electrode CG1 has a tail shape that expands in a lateral direction as it comes closer to the semiconductor substrate SB. The tail length of the bottom surface of the control gate electrode CG1 is expressed by a distance "d1".

The film thickness amount by which the silicon film PS1 is removed in the second dry etching process, that is, the etching amount, is expressed by a distance "c1". All of the film thickness "a" and the distances "b1" and "c1" are distances in a direction (perpendicular direction) perpendicular to the main surface of the semiconductor substrate SB, and a relation among the distances is expressed by "a=b1+c1".

Figure 22:
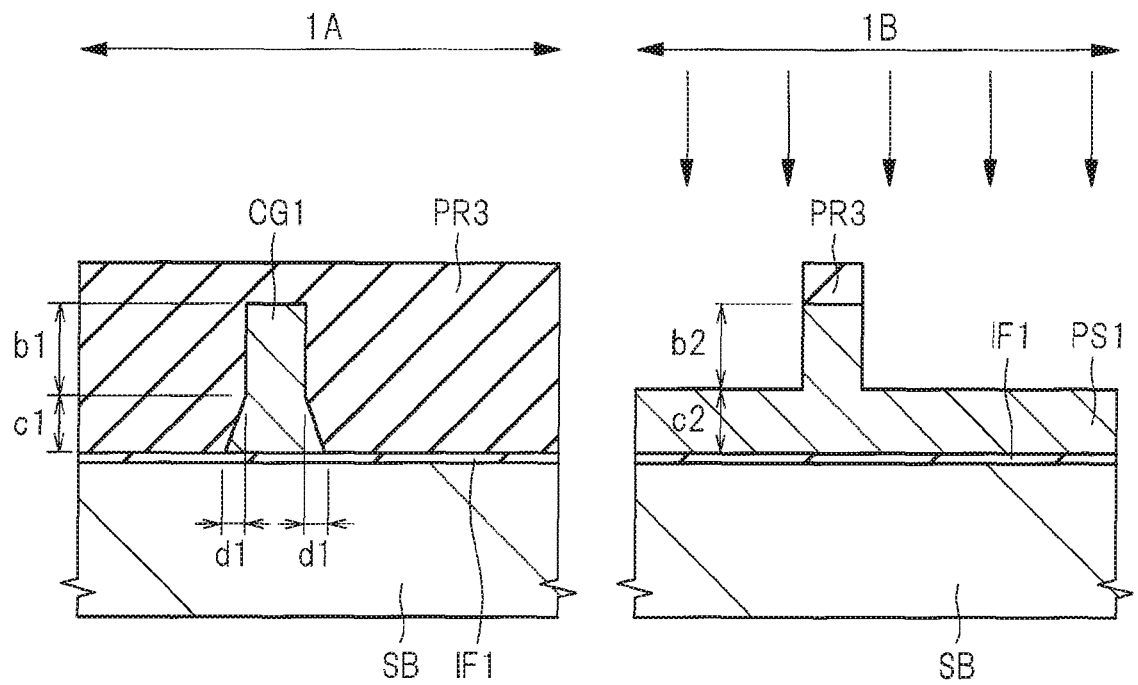
FIG. 22 is a cross-sectional view during a process of manufacturing the semiconductor device, continued from FIG. 21.

Next, as shown in FIG. 22, after the photoresist film PR2 is removed, the same processes as those explained with reference to FIG. 13 are performed. That is, by performing the third dry etching using a photoresist film PR3 as a mask, the upper surface of the silicon film PS1 exposed from the photoresist film PR3 is recessed by a distance "b2". In the third dry etching, as similar to the second embodiment, the length of the etching time is appropriately determined in accordance with the etching time setting table shown in FIG. 11. The photoresist film PR3 formed at this time is a resist pattern that covers the entire main surface of the semiconductor substrate SB in the first memory cell region 1A and covers the upper surface of a part of the silicon film PS1 in the second memory cell region 1B.

In this case, in order to form a memory cell having characteristics of a high writing speed, a low erasing speed and a good retention property in the second memory cell region 1B, the length of the etching time of the third dry etching in accordance with the film thickness "a" is determined based on the etching time setting table shown in FIG. 11.

Figure 23:
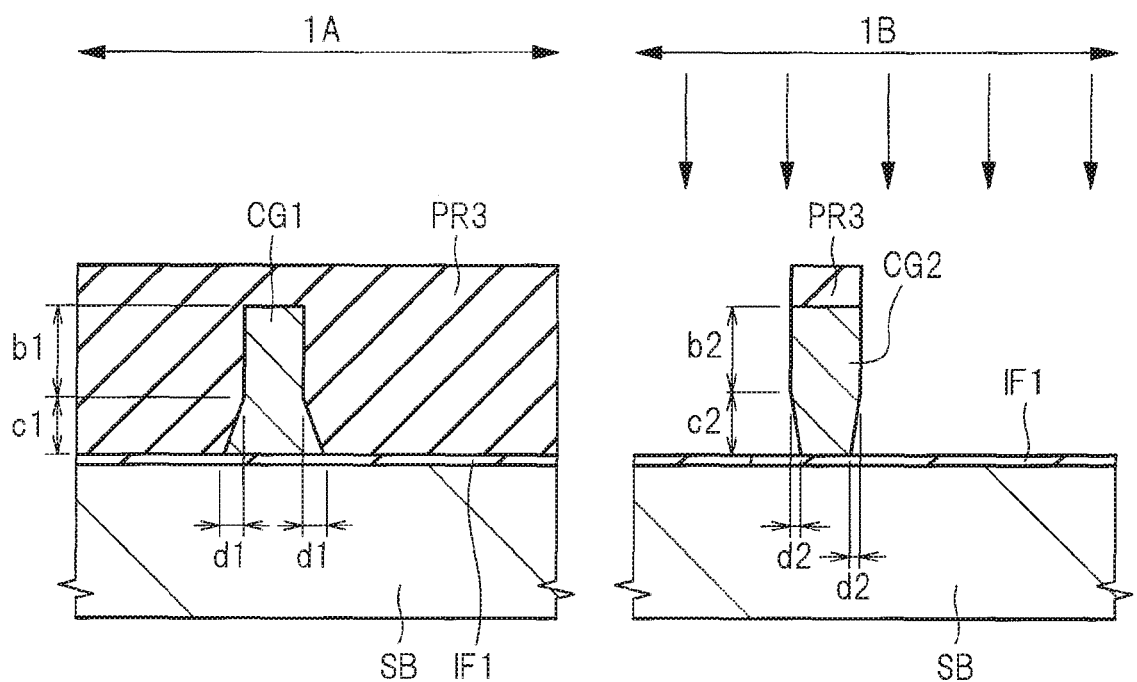
FIG. 23 is a cross-sectional view during a process of manufacturing the semiconductor device, continued from FIG. 22.

Successively, as shown in FIG. 23, by performing the fourth dry etching using the photoresist film PR3 as a mask as similar to the process explained with reference to FIG. 14, the silicon film PS1 not covered with the photoresist film PR3 is removed, so that the insulating film IF1 is exposed, and a control gate electrode CG2 made of the silicon film PS1 is formed. The lower portion of the side surface of the control gate electrode CG2 has a reversed taper shape whose width narrows in a lateral direction as it comes closer to the semiconductor substrate SB since the fourth dry etching is the etching performed under conditions having characteristics closer to the characteristics of the isotropic etching than those of the second dry etching.

A recessed width of a bottom surface of the control gate electrode CG2 is expressed by a distance "d2". The distance (recessed width, recessed amount) "d2" indicates a distance by which the end of the lower surface of the control gate electrode CG2 is recessed from the end of the upper surface of the control gate electrode CG2 toward the center of the control gate electrode CG2 in the gate length direction.

The film thickness amount by which the silicon film PS1 is removed in the fourth dry etching process, that is, the etching amount, is expressed by a distance "c2". All of the film thickness "a" and the distances "b2" and "c2" are distances in a perpendicular direction, and a relation among the distances is expressed by "a=b2+c2".

Figure 24:
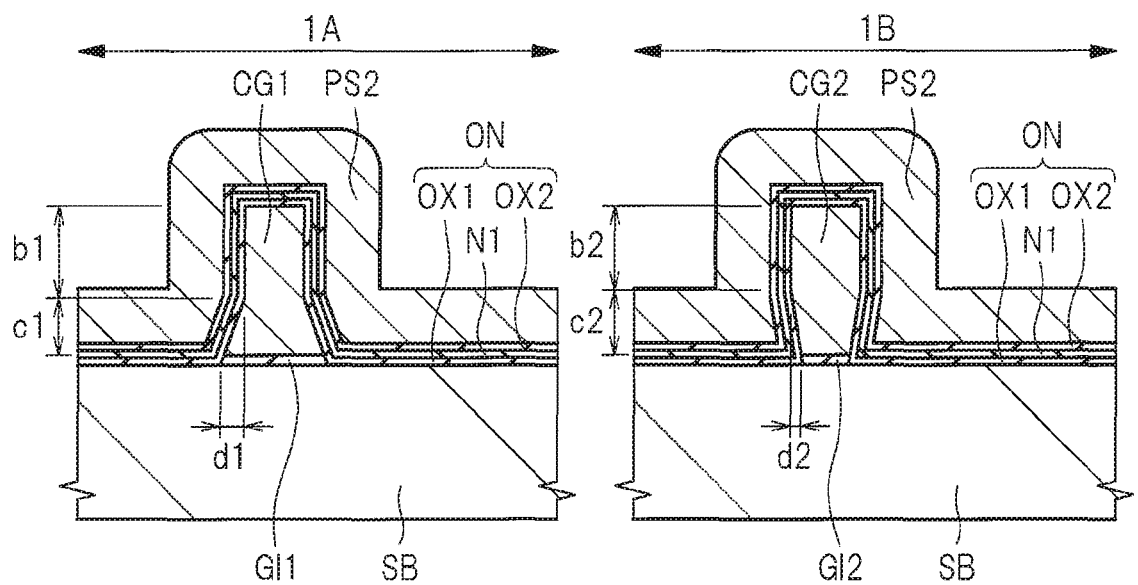
FIG. 24 is a cross-sectional view during a process of manufacturing the semiconductor device, continued from FIG. 23.

Next, as shown in FIG. 24, by performing the same process as that explained with reference to FIG. 4 after the photoresist film PR3 is removed, a gate insulating film GI1 made of the insulating film IF1 in the first memory cell region 1A and a gate insulating film GI2 made of the insulating film IF1 in the second memory cell region 1B are formed. Then, an ONO film ON and a silicon film PS2 are successively formed on the main surface of the semiconductor substrate SB.

Figure 25:
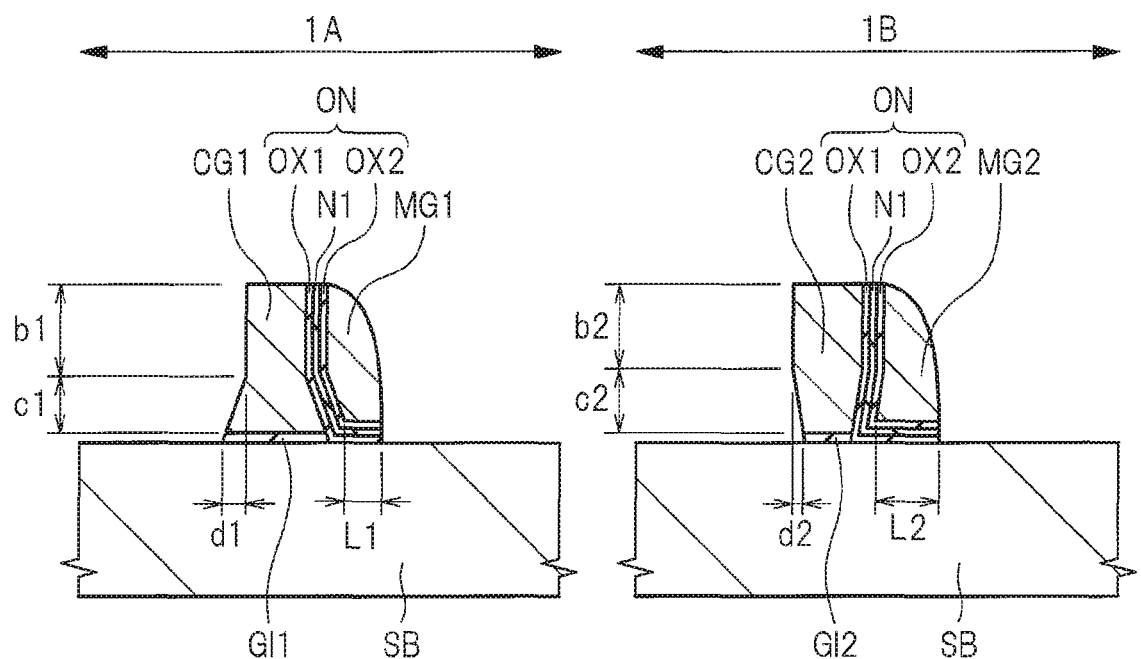
FIG. 25 is a cross-sectional view during a process of manufacturing the semiconductor device, continued from FIG. 24.

Next, as shown in FIG. 25, the same processes as the processes explained with reference to FIG. 5 and FIG. 6 are performed. Thus, a sidewall-shaped memory gate electrode MG1 made of the silicon film PS2 is formed next to one of side surfaces of the control gate electrode CG1 through the ONO film ON, and a sidewall-shaped memory gate electrode MG2 made of the silicon film PS2 is formed next to one of side surfaces of the control gate electrode CG2 through the ONO film ON. The gate length L1 of the memory gate electrode MG1 formed adjacent to the control gate electrode CG1 having the tail shape is smaller than the gate length L2 of the memory gate electrode MG2 formed adjacent to the control gate electrode CG2 having the reversed taper shape.

Figure 26:
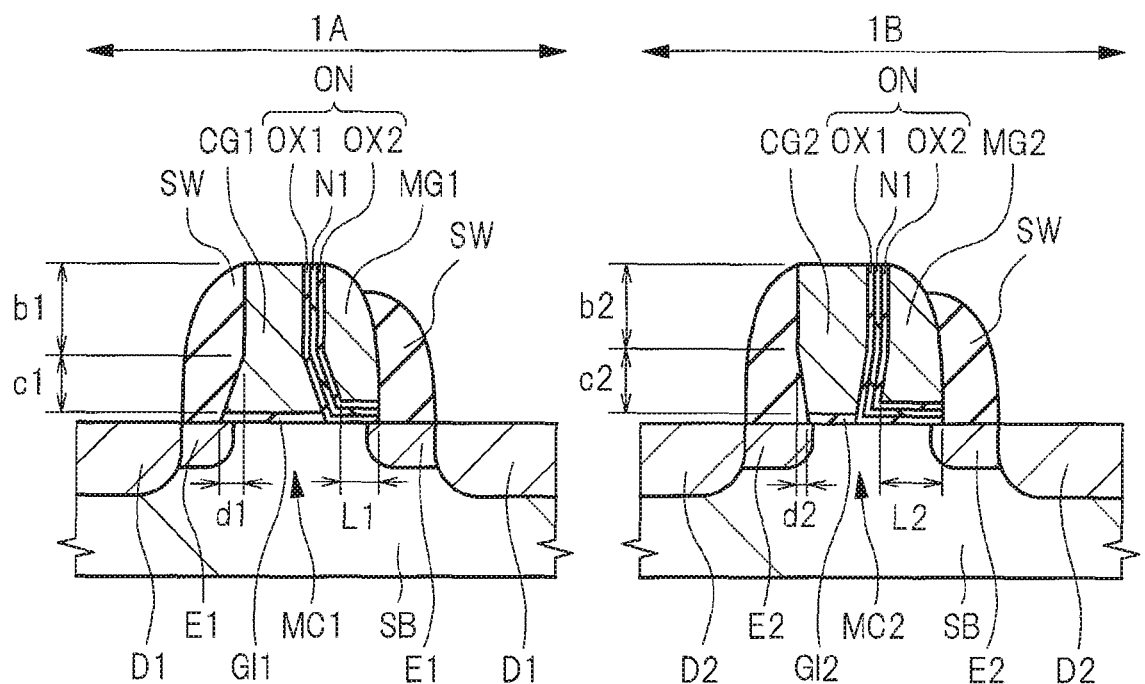
FIG. 26 is a cross-sectional view during a process of manufacturing the semiconductor device, continued from FIG. 25.

Next, as shown in FIG. 26, by performing the same process as that explained with reference to FIG. 7, a pair of extension regions E1 are formed in the first memory cell region 1A and a pair of extension regions E2 are formed in the second memory cell region 1B.

Successively, by performing the same process as that explained with reference to FIG. 8, sidewalls SW which are insulating films covering side surfaces on both sides of a pattern including the gate insulating film GI1, the control gate electrode CG1, the ONO film ON and the memory gate electrode MG1, are formed in the first memory cell region 1A. And, sidewalls SW which are insulating films covering side surfaces on both sides of a pattern including the gate insulating film GI2, the control gate electrode CG2, the ONO film ON and the memory gate electrode MG2, are formed in the second memory cell region 1B. Then, a pair of diffusion regions D1 are formed in the first memory cell region 1A, and a pair of diffusion regions D2 are formed in the second memory cell region 1B.

The extension region E1 and the diffusion region D1 constitute the source/drain regions of the first memory cell region 1A, and the extension region E2 and the diffusion region D2 constitute the source/drain regions of the second memory cell region 1B. The extension regions E1 and E2 may be formed by using different conditions from each other. Moreover, the diffusion regions D1 and D2 may be formed by using different conditions from each other. Then, an activation annealing process is performed thereon. Thus, a control transistor and a memory transistor as well as memory cells MC1 and MC2 made of these transistors, are formed.

That is, the control gate electrode CG1 and the paired source/drain regions next to the control gate electrode constitute a control transistor. Moreover, the memory gate electrode MG1 and the paired source/drain regions next to the memory gate electrode constitute a memory transistor. Similarly, the control gate electrode CG2 and the paired source/drain regions next to the control gate electrode constitute a control transistor. Moreover, the memory gate electrode MG2 and the paired source/drain regions next to the memory gate electrode constitute a memory transistor. The control transistor and the memory transistor in the first memory cell region 1A constitute a memory cell MC1 of a split-gate-type MONOS memory, and the control transistor and the memory transistor in the second memory cell region 1B constitute a memory cell MC2 of a split-gate-type MONOS memory.

Figure 27:
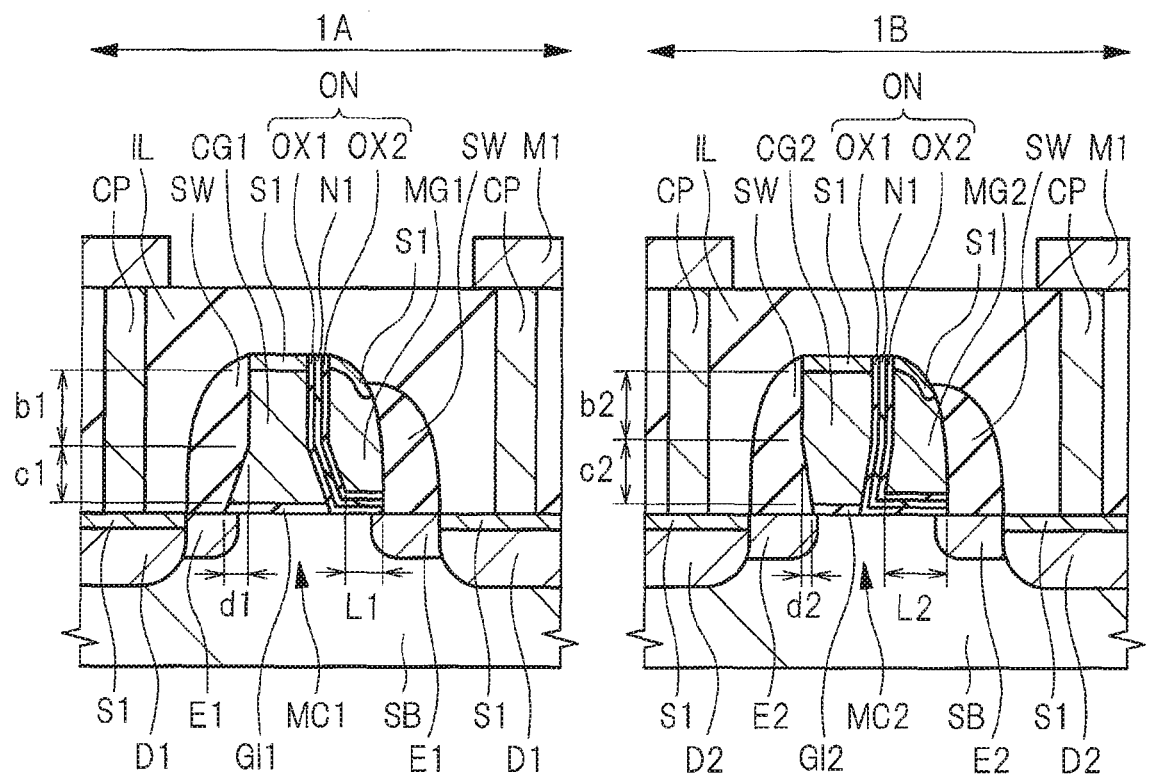
FIG. 27 is a cross-sectional view during a process of manufacturing the semiconductor device, continued from FIG. 26.

Next, as shown in FIG. 27, the same processes as those explained with reference to FIG. 9 and FIG. 10 are performed. Thus, a silicide layer S1, an interlayer insulating film IL, contact plugs CP and wiring M1 are formed. Then, a plurality of semiconductor chips are obtained by forming a laminated wiring layer by successively forming a second wiring layer, a third wiring layer, and others, and then, individualizing the semiconductor wafer into pieces by a dicing process. In the manner as described above, a semiconductor device of the present embodiment is manufactured.

In the method of manufacturing the semiconductor device according to the present embodiment, the control gate electrodes CG1 and CG2 having different cross-sectional shapes from each other are formed in the first memory cell region 1A and the second memory cell region 1B, respectively. For this reason, the memory cell MC1 with the memory gate electrode MG1 having the gate length L1 and the memory cell MC2 with the memory gate electrode MG2 having the gate length L2 larger than the gate length L1 can be mounted together on the same semiconductor chip. In this case, as explained with reference to FIG. 20 to FIG. 23, the processes are performed in accordance with the etching time setting table shown in FIG. 11 in order to form the memory having the different characteristics between the dry etching process to be performed to form the control gate electrode CG1 and the dry etching process to be performed to form the control gate electrode CG2.

Thus, the control gate electrode CG1 having the tail shape and the control gate electrode CG2 having the reversed taper shape can be differently formed. Therefore, by forming the sidewall-shaped memory gate electrodes MG1 and MG2 so as to be adjacent to the respective side surfaces of these control gate electrodes CG1 and CG2 and be self-aligned, the gate length L1 of the memory gate electrode MG1 to be formed in the first memory cell region 1A and the gate length L2 of the memory gate electrode MG2 to be formed in the second memory cell region 1B can be controlled so as to have different sizes from each other.

Therefore, by using the method of manufacturing the semiconductor device according to the present embodiment, the memory cells having the different characteristics from one another can be formed on the same semiconductor chip for each type. Therefore, when the memories required for the different performances from one another are formed, it is not required to separately prepare a semiconductor chip on which a memory having predetermined characteristics is mounted and another semiconductor chip on which a memory having another characteristics is mounted. Therefore, the semiconductor device can be miniaturized. Moreover, a degree of freedom in a layout of the semiconductor device can be enhanced. Furthermore, the manufacturing cost of the semiconductor device can be reduced.

At this time, note that the respective values of the distances "b1" and "b2" may be the same as or different from each other, and the respective values of the distances "c1" and "c2" may be the same as or different from each other.

First Modified Example

Figure 28:
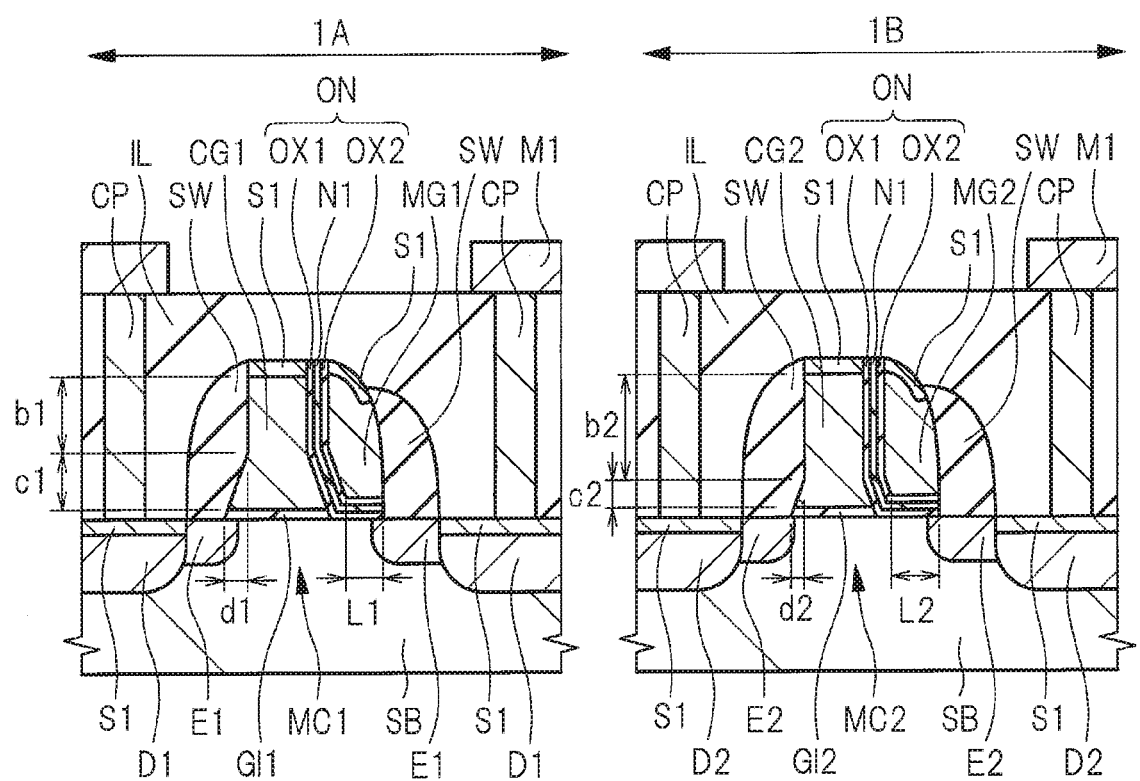
FIG. 28 is a cross-sectional view of a semiconductor device according to a first modification example of the third embodiment of the present invention.

FIG. 28 shows a cross-sectional view of a semiconductor device according to a first modified example of the present embodiment. As similar to FIG. 18, FIG. 28 shows the first memory cell region 1A and the second memory cell region 1B so as to be next to each other.

The configuration shown in FIG. 28 is the same as the configuration as the configuration explained with reference to FIG. 18 except that the gate length L2 of the memory gate electrode MG2 is reduced so as to follow the tail shape of the control gate electrode CG2. However, the respective values of the distances "b1" and "b2" are different from each other, and the respective values of the distances "c1" and "c2" are different from each other.

The memory cell MC1 in the first memory cell region 1A of the present modified example can be formed by the same manufacturing method as that of the memory cell MC1 explained with reference to FIG. 19 to FIG. 27. Meanwhile, the memory cell MC2 in the second memory cell region 1B of the same can be formed by the same manufacturing method as that of the memory cell MC1 explained with reference to FIG. 19 to FIG. 27. Therefore, each of both of the control gate electrodes CG1 and CG2 has the tail shape. However, the distance "b2" of the third portion of the control gate electrode CG2 in the perpendicular direction (height direction) is larger than the distance "b1" of the first portion of the control gate electrode CG1 in the perpendicular direction (height direction). For this reason, the distance "c2" of the fourth portion of the control gate electrode CG2 in the perpendicular direction (height direction) is smaller than the distance "c1" of the second portion of the control gate electrode CG1 in the perpendicular direction (height direction).

Therefore, the tail length "d2" of the control gate electrode CG2 is smaller than the tail length "d1" of the control gate electrode CG1. Such a configuration can be achieved by setting the etching time in accordance with the etching time setting table of FIG. 11, based on the premise that the memory cell MC2 having characteristics of, for example, a higher writing speed than desired characteristics of the memory cell MC1 to be formed in the first memory cell region 1A is formed in the second memory cell region 1B when the third dry etching for forming the control gate electrode CG2 is formed.

That is, even when the memory cell MC1 with the control gate electrode CG1 having the tail shape and the memory cell MC2 with the control gate electrode CG2 having the tail shape are formed on the same semiconductor substrate SB, a difference in the performances between the memory cells MC1 and MC2 can be made by setting the different length of the etching time between the first dry etching and the third dry etching.

In other words, the distance "b1" is made smaller than the distance "b2" by performing the first dry etching for forming the first portion of the control gate electrode CG1 so as to be shorter than the third dry etching for forming the third portion of the control gate electrode CG2. As a result, the distance "c1" is made larger than the distance "c2" since the second dry etching for forming the second portion of the control gate electrode CG1 is performed for a longer period of time than that of the fourth dry etching for forming the fourth portion of the control gate electrode CG2. Therefore, the tail length "d1" can be made larger than the tail length "d2", so that the gate length L1 of the memory gate electrode MG1 can be made smaller than the gate length L2 of the memory gate electrode MG2.

By achieving such a configuration, the memory cells MC1 and MC2 having the smaller difference in the performances therebetween than those in the configuration shown in FIG. 18 can be formed.

Second Modified Example

Figure 29:
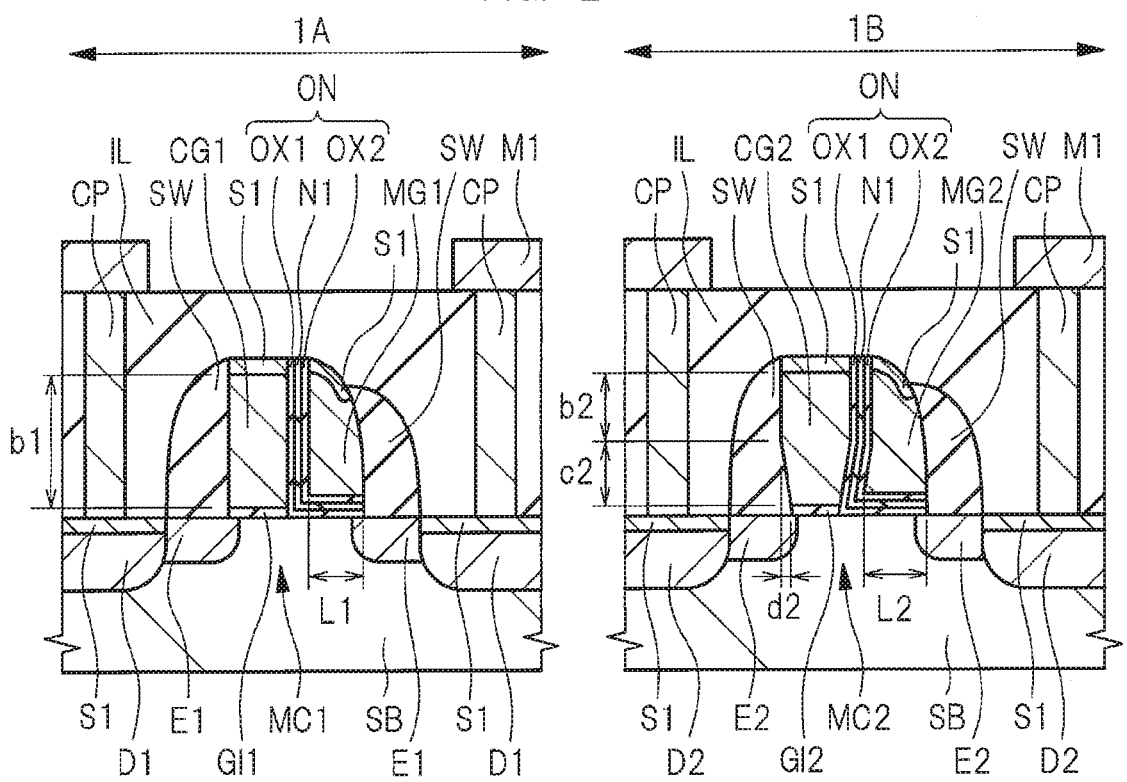
FIG. 29 is a cross-sectional view of a semiconductor device according to a second modification example of the third embodiment of the present invention.

FIG. 29 shows a cross-sectional view of a semiconductor device according to a second modified example of the present embodiment. As similar to FIG. 18, FIG. 29 shows the first memory cell region 1A and the second memory cell region 1B so as to be next to each other.

The configuration shown in FIG. 29 is the same as the configuration explained with reference to FIG. 18 except that the control gate electrode CG1 does not have the tail shape but has only the perpendicular side surface, which results in the expansion of the gate length L1 of the memory gate electrode MG1. However, the respective values of the distances "b1" and "b2" are different from each other, and the distance "c1" is 0 or a value close to 0.

The memory cell MC2 in the second memory cell region 1B of the present modified example can be formed by the same manufacturing method as that of the memory cell MC2 explained with reference to FIG. 19 to FIG. 27. Meanwhile, the control gate electrode CG1 in the first memory cell region 1A is formed by removing almost all the film thickness of the silicon film PS1 (see FIG. 19) by the first dry etching, and therefore, has a rectangular cross-sectional shape.

As described above, the control gate electrode CG1 having neither the tail shape nor the reversed taper shape but having the perpendicular side surface may be formed as the electrode for forming the memory cell MC1. Also in the present modified example, the difference between the gate length L1 of the memory gate electrode MG1 and the gate length L2 of the memory gate electrode MG2 can be made, and therefore, the same effects as those of the semiconductor device explained with reference to FIG. 18 can be obtained.

Third Modified Example

Figure 30:
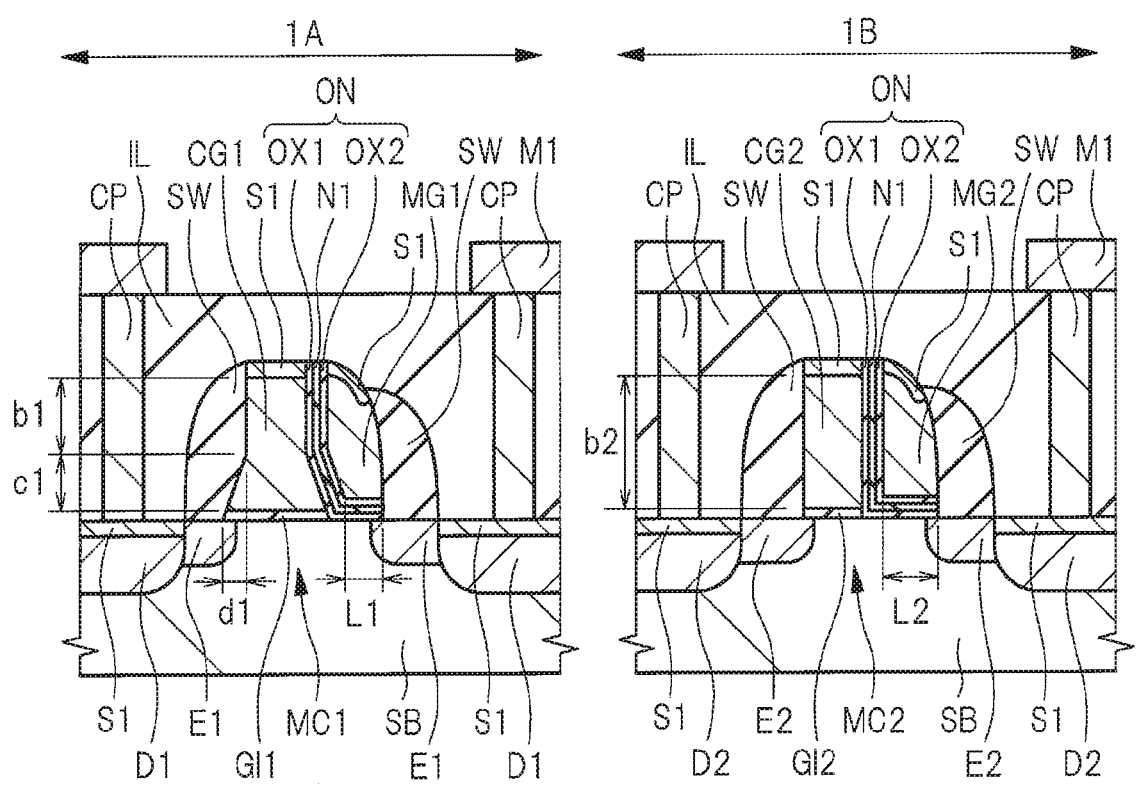
FIG. 30 is a cross-sectional view of a semiconductor device according to a third modification example of the third embodiment of the present invention.

FIG. 30 shows a cross-sectional view of a semiconductor device according to a third modified example of the present embodiment. As similar to FIG. 18, FIG. 30 shows the first memory cell region 1A and the second memory cell region 1B so as to be next to each other.

The configuration shown in FIG. 30 is the same as the configuration explained with reference to FIG. 18 except that the control gate electrode CG1 does not have the tail shape but has only the perpendicular side surface, which results in the reduction of the gate length L2 of the memory gate electrode MG2. However, the respective values of the distances "b1" and "b2" are different from each other, and the distance "c2" is 0 or a value close to 0.

As different from the above-described second modified example, the memory cell MC1 with the control gate electrode CG1 having the tail shape and the memory cell MC2 with the control gate electrode CG2 having the side surface extending along the perpendicular direction may be mounted together as described in the present modified example. Also in this case, a difference between the gate length L1 of the memory gate electrode MG1 and the gate length L2 of the memory gate electrode MG2 can be made, and therefore, the same effects as those of the semiconductor device explained with reference to FIG. 18 can be obtained.

Fourth Modified Example

Figure 31:
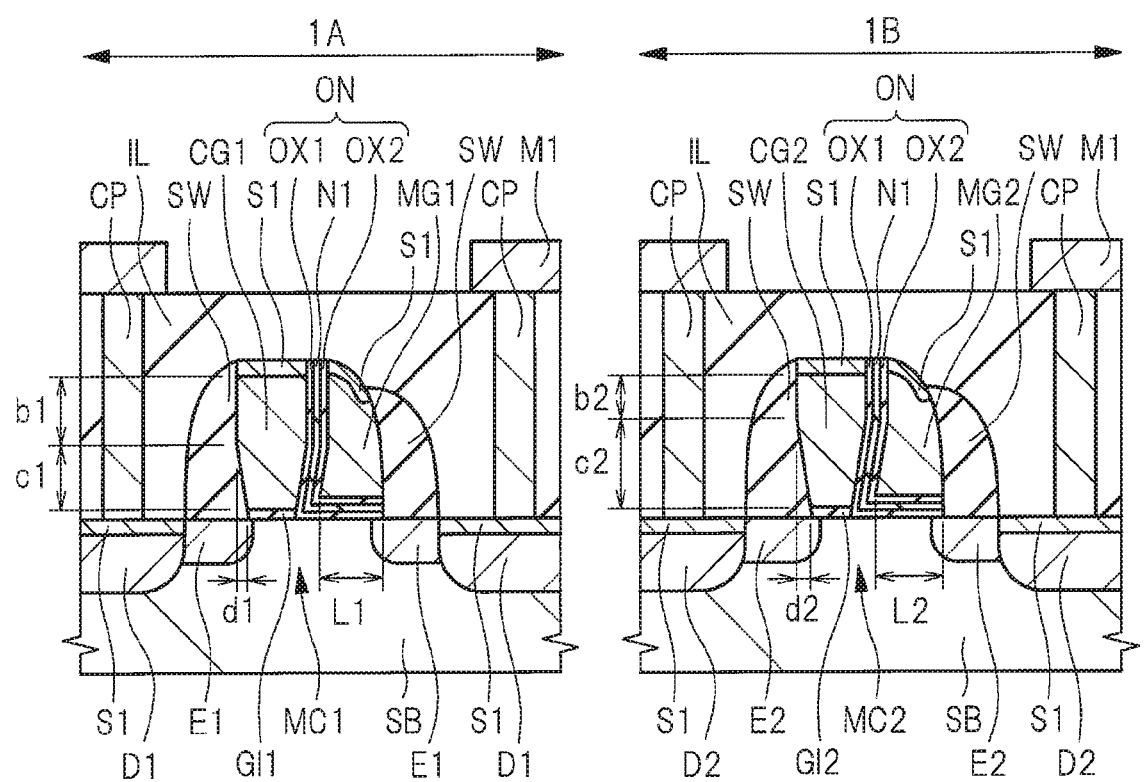
FIG. 31 is a cross-sectional view of a semiconductor device according to a fourth modification example of the third embodiment of the present invention.

FIG. 31 shows a cross-sectional view of a semiconductor device according to a fourth modified example of the present embodiment. As similar to FIG. 18, FIG. 31 shows the first memory cell region 1A and the second memory cell region 1B so as to be next to each other.

As different from the semiconductor device of the above-described first modified example shown in FIG. 28, each of both of the control gate electrodes CG1 and CG2 to be formed in the first memory cell region 1A and the second memory cell region 1B, respectively, may be formed into a reversed taper shape as shown in FIG. 31. In this case, the distance "b1" of the first memory cell region 1A is made larger than the distance "b2" of the second memory cell region 1B. That is, the first dry etching to be performed for forming the first portion of the control gate electrode CG1 is performed for a longer period of time than that of the third dry etching to be performed for forming the third portion of the control gate electrode CG2. Therefore, the distance "b1" is made larger than the distance "b2".

As a result, the distance "c1" is made smaller than the distance "c2" since the time of the second dry etching to be performed for forming the second portion of the control gate electrode CG1 is made shorter than the time of the fourth dry etching to be performed for forming the fourth portion of the control gate electrode CG2. Therefore, since the recessed width "d1" is made smaller than the recessed width "d2", the gate length L1 of the memory gate electrode MG1 can be made smaller than the gate length L2 of the memory gate electrode MG2.

By achieving such a configuration, the memory cells MC1 and MC2 having the smaller difference in the performances therebetween than those in the configuration shown in FIG. 18 can be formed.

In the foregoing, the invention made by the present inventors has been concretely described based on the embodiments. However, it is needless to say that the present invention is not limited to the foregoing embodiments and various modifications and alterations can be made within the scope of the present invention.

What is claimed is:

1. A method of manufacturing a semiconductor device comprising the steps of:
   (a) preparing a first semiconductor substrate;
   (b) forming a first conductive film having a first film thickness on a main surface of the first semiconductor substrate through a first insulating film;
   (c) recessing an upper surface of a part of the first conductive film to a depth in the middle of the first conductive film by performing a first dry etching;
   (d) after the step of (c), forming a first control gate electrode composed of the first conductive film by exposing the first insulating film by removing the part of the first conductive film by performing a second dry etching under different conditions from conditions of the first dry etching;
   (e) forming a second insulating film including a charge storage part inside thereof on the first semiconductor substrate so as to cover the first control gate electrode;
   (f) forming a second conductive film so as to cover the first control gate electrode and the second insulating film;
   (g) forming a sidewall-shaped first memory gate electrode composed of the second conductive film so as to be next to the first control gate electrode by exposing a part of the main surface of the first semiconductor substrate from the second conductive film by performing a third dry etching to the second conductive film; and
   (h) forming first source/drain regions on the main surface of the first semiconductor substrate, wherein the first control gate electrode, the first memory gate electrode and the first source/drain regions constitute a first memory cell, and,
in the step of (c), a length of time of the first dry etching is set in accordance with the first film thickness and desired characteristics of the first memory cell, based on an etching time setting table.

2. The method of manufacturing the semiconductor device according to claim 1,
wherein the first insulating film is composed of a silicon oxide film, and
a selection ratio of the first dry etching relative to silicon oxide is lower than a selection ratio of the second dry etching relative to silicon oxide.

3. The method of manufacturing the semiconductor device according to claim 1,
wherein the first control gate electrode is composed of a first portion and a second portion below the first portion,
a side surface of the first portion is along a direction perpendicular to the main surface of the first semiconductor substrate,
a side surface of the second portion has a taper shape relative to the main surface of the first semiconductor substrate, and
a width of the second portion of the first control gate electrode in a gate length direction is made larger as the second portion comes closer to the main surface of the first semiconductor substrate.

4. The method of manufacturing the semiconductor device according to claim 1,
wherein the first control gate electrode is composed of a first portion and a second portion below the first portion,
a side surface of the first portion is along a direction perpendicular to the main surface of the first semiconductor substrate,
a side surface of the second portion has a reversed taper shape relative to the main surface of the first semiconductor substrate, and
a width of the second portion of the first control gate electrode in a gate length direction is made smaller as the second portion comes closer to the main surface of the first semiconductor substrate.

5. The method of manufacturing the semiconductor device according to claim 1, comprising the steps of:
(a1) preparing a second semiconductor substrate;
(b1) forming a third conductive film having a second film thickness on a main surface of the second semiconductor substrate through a third insulating film;
(c1) recessing an upper surface of a part of the third conductive film to a depth in the middle of the third conductive film by performing a fourth dry etching;
(d1) after the step of (c1), forming a second control gate electrode composed of the third conductive film by exposing the third insulating film by removing the part of the third conductive film by performing a fifth dry etching under different conditions from conditions of the fourth dry etching;
(e1) forming a fourth insulating film including a charge storage part inside thereof on the second semiconductor substrate so as to cover the second control gate electrode;
(f1) forming a fourth conductive film so as to cover the second control gate electrode and the fourth insulating film;

(g1) forming a sidewall-shaped second memory gate electrode composed of the fourth conductive film so as to be next to the second control gate electrode by exposing a part of the main surface of the second semiconductor substrate from the fourth conductive film by performing a sixth dry etching to the fourth conductive film; and
(h1) forming second source/drain regions on the main surface of the second semiconductor substrate,
wherein the second control gate electrode, the second memory gate electrode and the second source/drain regions constitute a second memory cell,
in the step of (c1), a length of time of the fourth dry etching is set in accordance with the second film thickness and desired characteristics of the second memory cell, based on the etching time setting table, and,
in the steps of (f) and (f1), the second conductive film and the fourth conductive film are formed in a state in which the first semiconductor substrate and the second semiconductor substrate are set inside a film-forming apparatus.

6. The method of manufacturing the semiconductor device according to claim 5,
wherein, in the step of (c), the first dry etching is performed for a longer period of time than the fourth dry etching.

7. The method of manufacturing the semiconductor device according to claim 5,
wherein, in the step of (d1), the fifth dry etching is performed for a longer period of time than the second dry etching.

8. The method of manufacturing the semiconductor device according to claim 5,
wherein the first control gate electrode is composed of a first portion and a second portion below the first portion,
a side surface of the second portion has a taper shape relative to the main surface of the first semiconductor substrate,
a width of the second portion of the first control gate electrode in a gate length direction is made larger as the second portion comes closer to the main surface of the first semiconductor substrate,
the second control gate electrode is composed of a third portion and a fourth portion below the third portion,
a side surface of the fourth portion has a reversed taper shape relative to the main surface of the second semiconductor substrate, and
a width of the fourth portion of the second control gate electrode in a gate length direction is made smaller as the fourth portion comes closer to the main surface of the second semiconductor substrate.

9. The method of manufacturing the semiconductor device according to claim 1,
wherein, in the step of (a), the first semiconductor substrate having a first region and a second region is prepared,
in the step of (b), the first insulating film and the first conductive film are formed in the first region and the second region,
in the step of (c), the upper surface of the part of the first conductive film in the first region is recessed,
in the step of (d), the first control gate electrode is formed in the first region,
the method further includes the steps of:

(c1) recessing the upper surface of the part of the first conductive film in the second region to a depth in the middle of the first conductive film by performing a fourth dry etching; and
(d1) after the step of (c1), forming a second control gate electrode composed of the first conductive film by exposing the first insulating film by removing the part of the first conductive film in the second region by performing a fifth dry etching, in the step of (e), the second insulating film is formed so as to cover the first control gate electrode and the second control gate electrode, in the step of (f), the second conductive film is formed so as to cover the first control gate electrode, the second control gate electrode and the second insulating film, in the step of (g), a sidewall-shaped second memory gate electrode composed of the second conductive film is formed so as to be next to the second control gate electrode by forming the first memory gate electrode by performing the third dry etching, in the step of (h), the first source/drain regions are formed in the first region, the method further includes the step of:
(h1) forming second source/drain regions on the main surface of the first semiconductor substrate in the second region, the second control gate electrode, the second memory gate electrode and the second source/drain regions constitute a second memory cell, in the step of (c1), a length of time of the fourth dry etching is set in accordance with the first film thickness and desired characteristics of the second memory cell, based on the etching time setting table, and a first gate length of the first memory gate electrode is smaller than a second gate length of the second memory gate electrode.

10. The method of manufacturing the semiconductor device according to claim 9,
wherein the first memory cell and the second memory cell are mounted together on a semiconductor chip.

* * * * *